(12) United States Patent
Doyon, Jr.

(10) Patent No.: US 7,719,114 B2
(45) Date of Patent: May 18, 2010

(54) EDIT STRUCTURE THAT ALLOWS THE INPUT OF A LOGIC GATE TO BE CHANGED BY MODIFYING ANY ONE OF THE METAL OR VIA MASKS USED TO FORM THE METAL INTERCONNECT STRUCTURE

(75) Inventor: Richard J. Doyon, Jr., Buxton, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 118 days.

(21) Appl. No.: 11/974,999

(22) Filed: Oct. 17, 2007

(65) Prior Publication Data

US 2009/0102512 A1  Apr. 23, 2009

(51) Int. Cl.
*H01L 23/48* (2006.01)
*H01L 23/52* (2006.01)

(52) U.S. Cl. .................. 257/758; 257/211; 257/209; 257/208; 257/750; 257/E21.526; 438/622; 326/47

(58) Field of Classification Search ............... 257/211, 257/48, E21.526, 208, 209, 758, 750; 438/622
See application file for complete search history.

(56) References Cited

U.S. PATENT DOCUMENTS

| | | | | |
|---|---|---|---|---|
| 6,262,446 | B1 * | 7/2001 | Koo et al. | 257/296 |
| 6,798,039 | B1 * | 9/2004 | Gillespie et al. | 257/531 |
| 2007/0262454 | A1 * | 11/2007 | Shibata | 257/758 |

* cited by examiner

*Primary Examiner*—Brook Kebede
*Assistant Examiner*—Maria Ligai
(74) *Attorney, Agent, or Firm*—Mark C. Pickering

(57) ABSTRACT

An edit structure is disclosed that allows the input of a logic gate to be changed by modifying any one of the metal and via masks that are used to form the metal interconnect structure. As a result, a first permanent logic state provided by a tie-in circuit can be changed to a second permanent logic state by modifying any one of the metal and via masks that are used to form the metal interconnect structure.

16 Claims, 15 Drawing Sheets

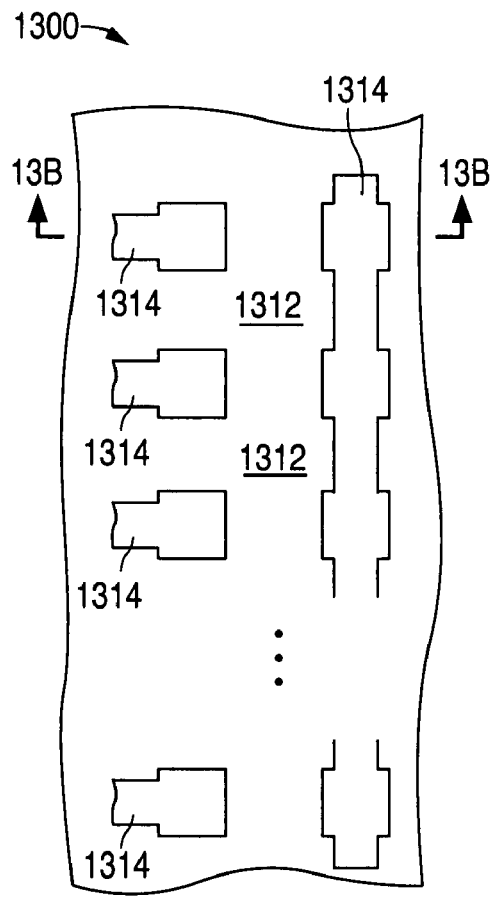
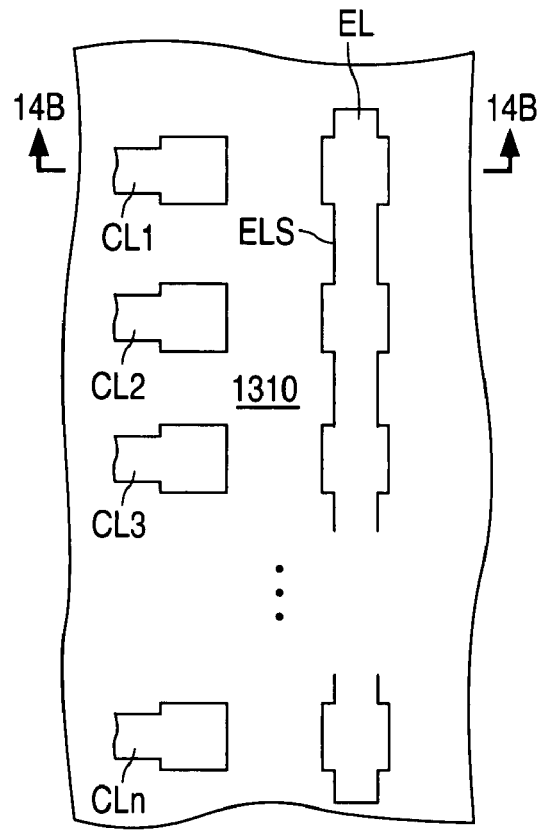
FIG. 13A  FIG. 14A
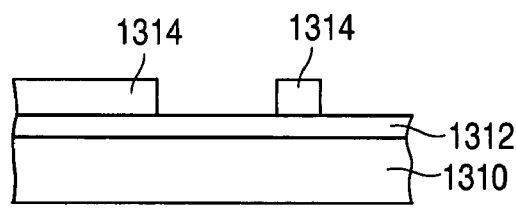
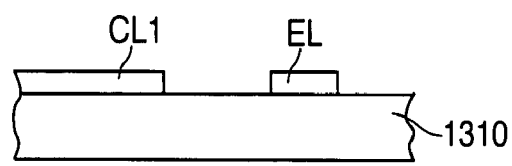
FIG. 13B  FIG. 14B

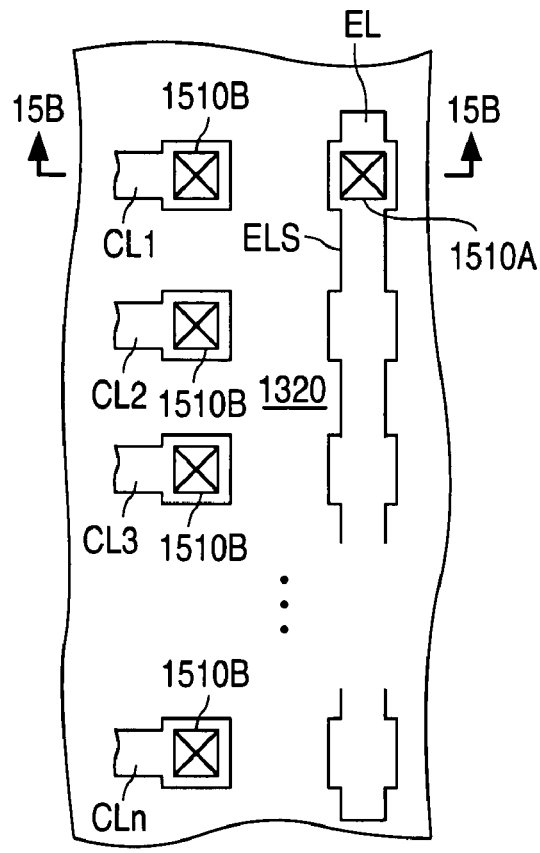
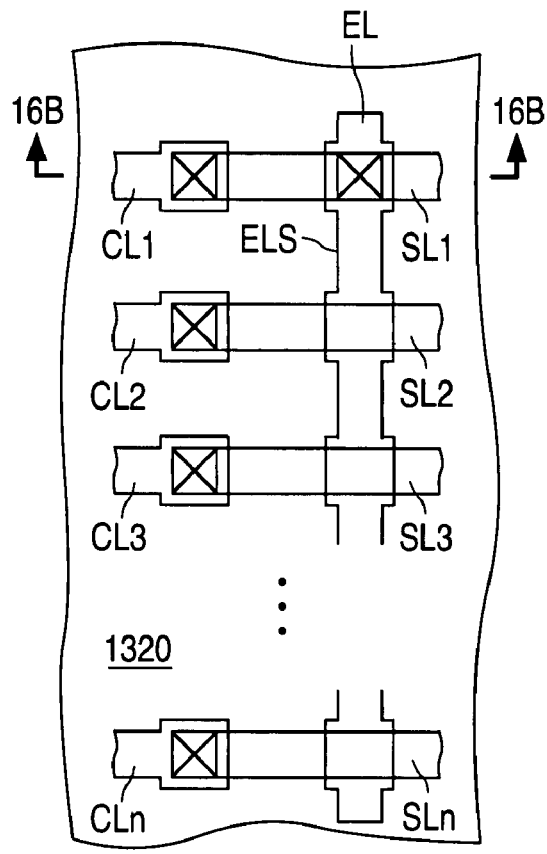
FIG. 15A  FIG. 16A
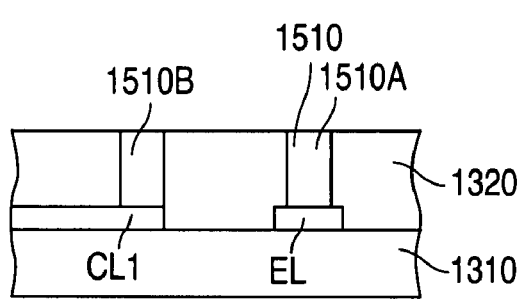
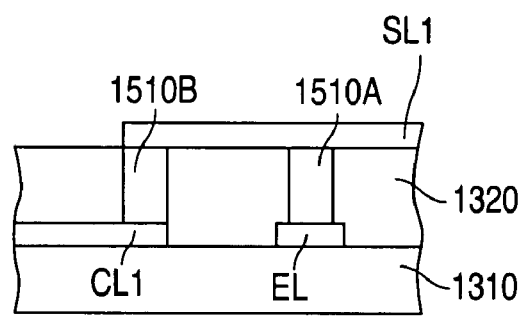
FIG. 15B  FIG. 16B

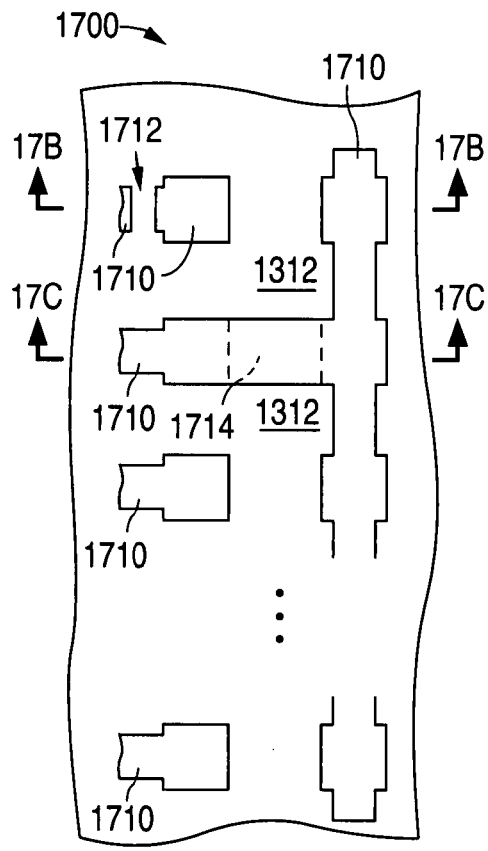
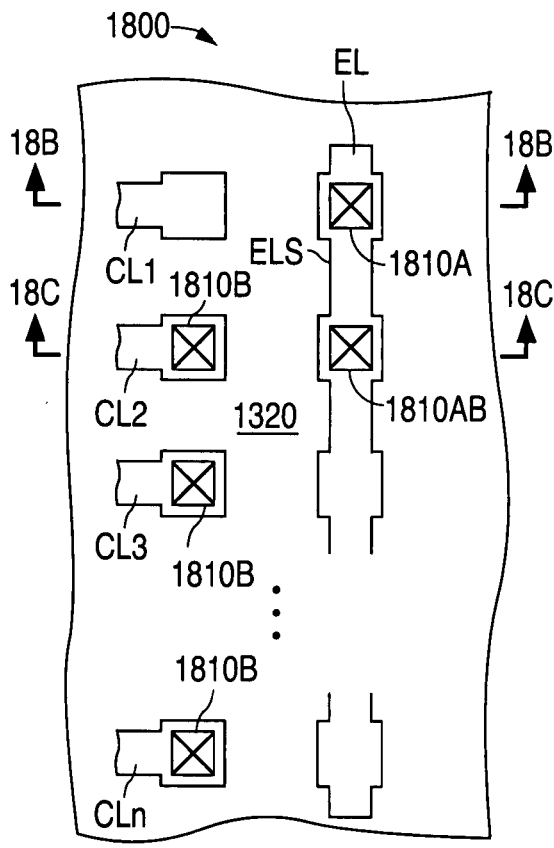
FIG. 17A  FIG. 18A
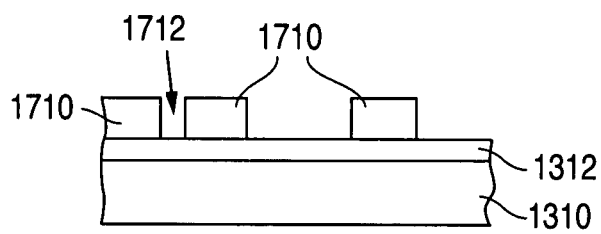
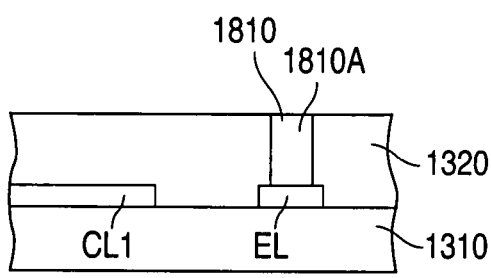
FIG. 17B  FIG. 18B
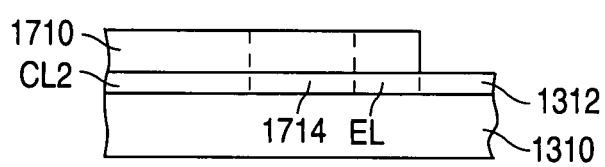
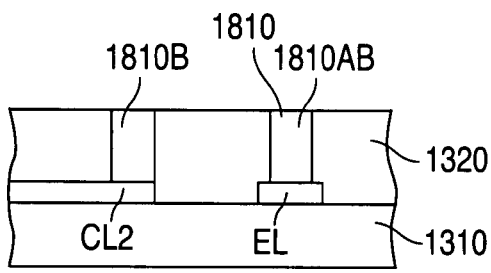
FIG. 17C  FIG. 18C

EDIT STRUCTURE THAT ALLOWS THE INPUT OF A LOGIC GATE TO BE CHANGED BY MODIFYING ANY ONE OF THE METAL OR VIA MASKS USED TO FORM THE METAL INTERCONNECT STRUCTURE

BACKGROUND OF THE INVENTION

1. Field of the Invention

The present invention relates to the input of a logic gate and, more particularly, to an edit structure that allows the input of a logic gate to be changed by modifying any one of the metal or vias masks used to form the metal interconnect structure.

2. Description of the Related Art

Logic circuits commonly include gates that have an input that is permanently connected to a logic high, or permanently connected to a logic low. Conventionally, the input of a logic gate was permanently connected to a logic high by connecting the input directly to a power supply line. Similarly, the input of a logic gate was permanently connected to a logic low by connecting the input directly to a ground line.

More recently, however, with sub-micron circuits, it is undesirable to permanently connect the input of a logic gate directly to the power supply line or the ground line. This is because the voltage and current spikes that can be present on the power supply line and the ground line can permanently damage the logic gate.

As a result, sub-micron circuits commonly use a "tie-in" circuit that connects the input of a logic gate to either a power supply line or a ground line. A tie-in circuit can be implemented in a number of different ways. One common method of implementing a tie-in circuit is as a polysilicon resistor structure.

FIGS. 1A-1D show views that illustrate an example of a prior-art tie-in circuit 100. FIG. 1A shows a plan view, while FIGS. 1B-1D show cross-sectional views taken along lines 1B-1B through 1D-1D, respectively, of FIG. 1A. As shown in FIGS. 1A-1D, tie-in circuit 100 includes a semiconductor material 110, such as a non-conductive region formed in single-crystal silicon.

In addition, as further shown in FIGS. 1A-1D, tie-in circuit 100 includes a polysilicon strip 112 that touches the top surface of semiconductor material 110, and a first isolation layer 114 that touches the top surfaces of semiconductor material 110 and polysilicon strip 112. Tie-in circuit 100 also includes a first contact 120 that extends through first isolation layer 114 to make an electrical connection to a first end of polysilicon strip 112, and a second contact 122 that extends through first isolation layer 114 to make an electrical connection to a second end of polysilicon strip 112.

Further, tie-in circuit 100 includes spaced-apart metal-1 strips 124 and 126. Metal-1 strip 124 has a first end connected to first contact 120, and a second end connected to the input of a logic gate. Metal-1 strip 126, in turn, is a two pronged structure that includes a base 126B that is connected to second contact 122, a first prong 126F, and a second prong 126S.

In the FIGS. 1A-1D example, first prong 126F is connected to a power supply line 130, and second prong 126S is spaced apart from a ground line 132. Thus, in the FIGS. 1A-1D example, the connection of first prong 126F to power supply line 130 defines tie-in circuit 100 as a "tie-high" circuit because one end of the circuit is connected to the input of the logic gate, while the other end of the circuit is connected to power supply line 130.

During the testing and evaluation of a semiconductor chip, it is often necessary to modify one of the logic circuits by changing the logic state that is permanently applied to the input of a logic gate. One common approach to changing the logic state that is permanently applied to the input of a logic gate is simply to change the tie-in circuit.

For example, to change the logic state placed on the input of a logic gate from a permanent logic high to a permanent logic low, the tie-in circuit can simply be changed from a tie-high circuit to a tie-low circuit. This change can be implemented by simply modifying the metal-1 mask so that first prong 126F is spaced apart and electrically isolated from power supply line 130, and second prong 126S is connected to touch ground line 132.

The FIGS. 1A-1D example illustrates a tie-in circuit where the end connected to the input of the logic gate, and the end connected to the power supply line (or ground line) are provided by the first metal layer (metal-1). Tie-in circuits, however, are commonly implemented with the ends connected to other metal layers. For example, the end connected to the input of the logic gate, and the end connected to power supply line 130 (or ground line 132) can be implemented in the fourth metal layer (metal-4).

FIGS. 2A-2D show views that illustrate an example of a prior-art tie-in circuit 200. FIG. 2A shows a plan view, while FIGS. 2B-2D show cross-sectional views taken along lines 2B-2B through 2D-2D, respectively, of FIG. 2A. Tie-in circuit 200 is similar to tie-in circuit 100 and, as a result, utilizes the same reference numerals to designate the elements which are common to both tie-in circuits.

As shown in FIGS. 2A-2D, tie-in circuit 200 is identical to tie-in circuit 100 except that tie-in circuit 200 also includes three more metal layers. More specifically, the metal-1 strips 124 and 126 are electrically connected to contacts 120 and 122, respectively, and electrically isolated from all other metal-1 structures.

In addition, tie-in circuit 200 further includes a second isolation layer 210 that touches the top surface of first isolation layer 114, a via 212 that extends through second isolation layer 210 to make an electrical connection to metal-1 strip 124, and a via 214 that extends through second isolation layer 210 to make an electrical connection to metal-1 strip 126. Further, tie-in circuit 200 includes spaced-apart metal-2 strips 220 and 222 that touch the top surface of second isolation layer 210. The spaced-apart metal-2 strips 220 and 222 are connected to vias 212 and 214, respectively, and electrically isolated from all other metal-2 structures.

Further, tie-in circuit 200 includes a third isolation layer 230 that touches the top surface of second isolation layer 210, a via 232 that extends through third isolation layer 230 to make an electrical connection to metal-2 strip 220, and a via 234 that extends through third isolation layer 230 to make an electrical connection to metal-2 strip 222. Further, tie-in circuit 200 includes spaced-apart metal-3 strips 236 and 238 that touch the top surface of third isolation layer 230. The spaced-apart metal-3 strips 236 and 238 are connected to vias 232 and 234, respectively, and electrically isolated from all other metal-3 structures.

Tie-in circuit 200 also includes a fourth isolation layer 240 that touches the top surface of third isolation layer 230, a via 242 that extends through fourth isolation layer 240 to make an electrical connection to metal-3 strip 236, and a via 244 that extends through fourth isolation layer 240 to make an electrical connection to metal-3 strip 238. Further, tie-in circuit 200 includes spaced-apart metal-4 strips 246 and 248 that touch the top surface of fourth isolation layer 240. The metal-4 strips 246 and 248 are connected to vias 242 and 244, respectively.

The metal-4 strips 246 and 248 are identical to metal-1 strips 124 and 126, respectively, with metal-4 strip 248 having a two pronged structure that includes a base 248B that is connected to via 244, a first prong 248F, and a second prong 248S. In the FIGS. 2A-2D example, first prong 248F is connected to a power supply line 250, and second prong 248S is spaced apart and electrically isolated from a ground line 252.

One of the disadvantages of tie-in circuits 100 and 200 is that each tie-in circuit has an input and an output that are associated with specific metal layers, regardless of which metal layer is used. The disadvantage of being associated with a specific metal layer is that if the tie-in circuit must be changed, then the mask associated with that specific metal layer must be changed, even if that is the only change to the mask.

For example, with tie-in circuit 100, to change the logic state placed on the input of a logic gate from a permanent logic high to a permanent logic low, the metal-1 mask must be modified so that first prong 126F is spaced apart and electrically isolated from power supply line 130, and second prong 126S is electrically connected to ground line 132, even if there is no other change to the metal-1 mask.

Modifying masks is an expensive and time consuming procedure. As a result, if the only modification to a mask was to change the state of a tie-in circuit, then the modification of the tie-in circuit becomes quite expensive.

BRIEF DESCRIPTION OF THE DRAWINGS

FIG. 1A is a plan view, while FIGS. 1B-1D are cross-sectional views taken along lines 1B-1B through 1D-1D, respectively, of FIG. 1A.

FIG. 2A is a plan view, while FIGS. 2B-2D are cross-sectional views taken along lines 2B-2B through 2D-2D, respectively, of FIG. 2A.

FIG. 3A is a plan view, while FIGS. 3B and 3C are cross-sectional views taken along lines 3B-3B and 3C-3C, respectively, of FIG. 3A.

FIG. 4A is a plan view, while FIGS. 4B and 4C are cross-sectional views taken along lines 4B-4B and 4C-4C, respectively, of FIG. 4A.

FIG. 5A is a plan view, while FIGS. 5B and 5C are cross-sectional views taken along lines 5B-5B and 5C-5C, respectively, of FIG. 5A.

FIG. 6A is a plan view, while FIGS. 6B and 6C are cross-sectional views taken along lines 6B-6B and 6C-6C, respectively, of FIG. 6A.

FIG. 7A is a plan view, while FIGS. 7B and 7C are cross-sectional views taken along lines 7B-7B and 7C-7C, respectively, of FIG. 7A.

FIG. 8A is a plan view, while FIGS. 8B and 8C are cross-sectional views taken along lines 8B-8B and 8C-8C, respectively, of FIG. 8A.

FIG. 9A is a plan view, while FIGS. 9B and 9C are cross-sectional views taken along lines 9B-9B and 9C-9C, respectively, of FIG. 9A.

FIG. 10A is a plan view, while FIGS. 10B and 10C are cross-sectional views taken along lines 10B-10B and 10C-10C, respectively, of FIG. 10A.

FIG. 11A is a plan view, while FIGS. 11B and 11C are cross-sectional views taken along lines 11B-11B and 11C-11C, respectively, of FIG. 11A.

FIG. 12A is a plan view, while FIGS. 12B and 12C are cross-sectional views taken along lines 12B-12B and 12C-12C, respectively, of FIG. 12A.

FIGS. 13A-16A and FIGS. 13B-16B are views illustrating an example of a method 1300 of forming an edit structure in accordance with the present invention. FIGS. 13A-16A are plan views, while FIGS. 13B-16B are cross-sectional views taken along line 13B-13B through line 16B-16B, respectively, of FIGS. 13A-16A.

FIGS. 17A-17C are views illustrating an example of a method 1700 of forming an edit structure in accordance with the present invention. FIG. 17A is a plan view, while FIGS. 17B and 17C are cross-sectional views taken along lines 17B-17B and 17C-17C, respectively, of FIG. 17A.

FIGS. 18A-18C are views illustrating an example of a method 1800 of forming an edit structure in accordance with the present invention. FIG. 18A is a plan view, while FIGS. 18B and 18C are cross-sectional views taken along lines 18B-18B and 18C-18C, respectively, of FIG. 18A.

DETAILED DESCRIPTION OF THE INVENTION

Figure 1A:
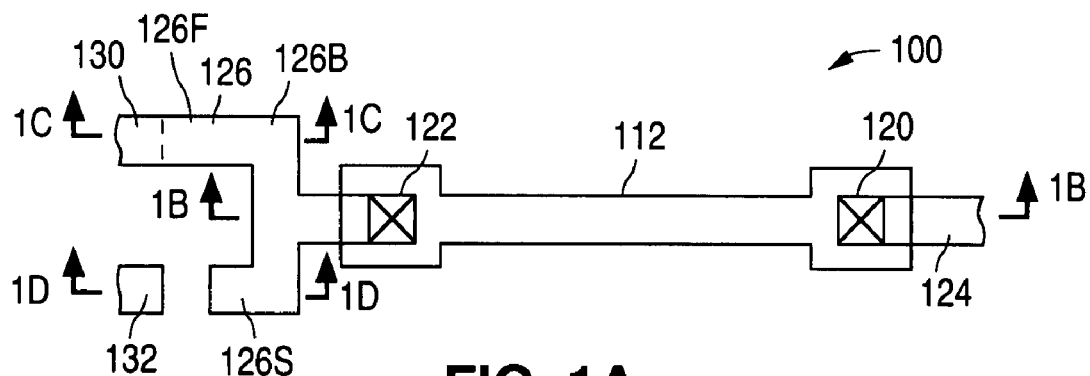
FIGS. 1A-1D are views illustrating an example of a prior-art tie-in circuit 100.
Figure 1B:
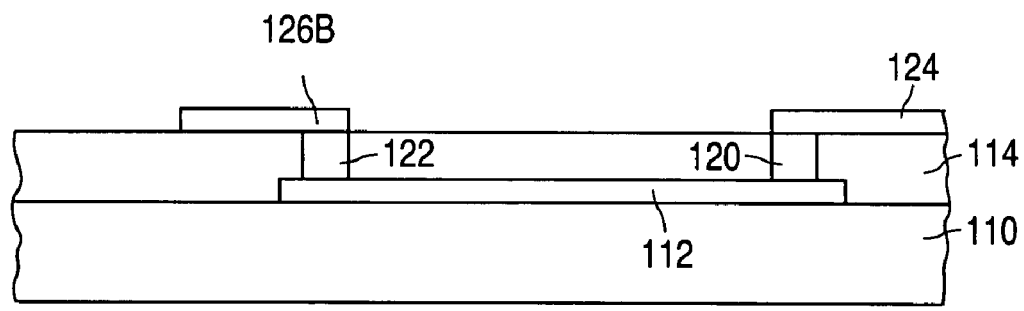
Figure 1C:
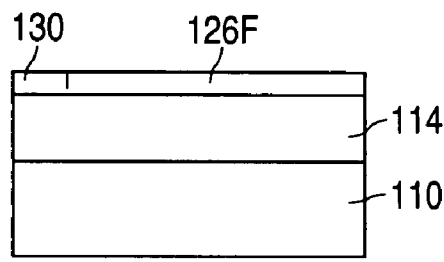
Figure 1D:
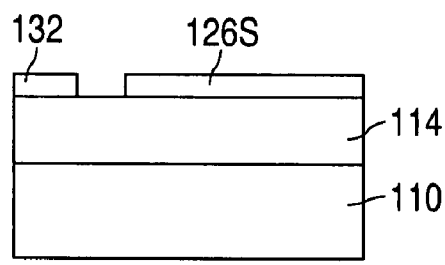
Figure 2A:
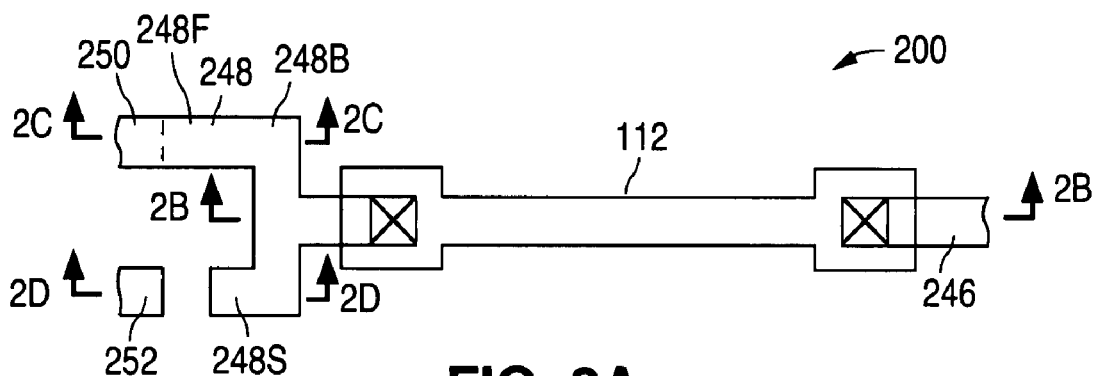
FIGS. 2A-2D are views illustrating an example of a prior-art tie-in circuit 200.
Figure 2B:
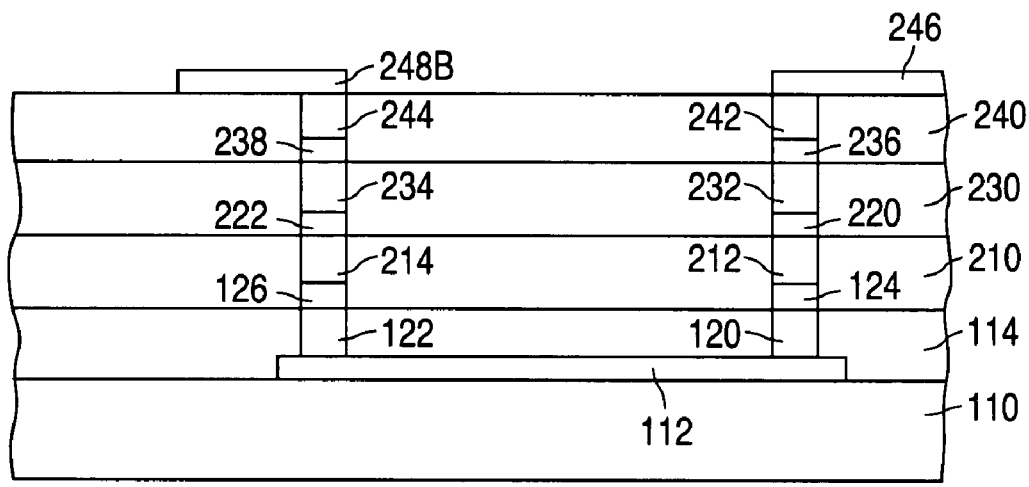
Figure 2C:
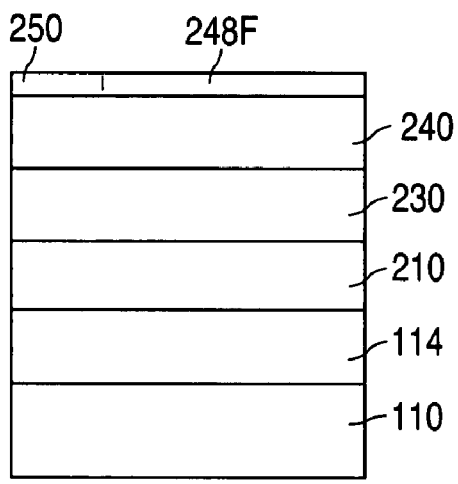
Figure 2D:
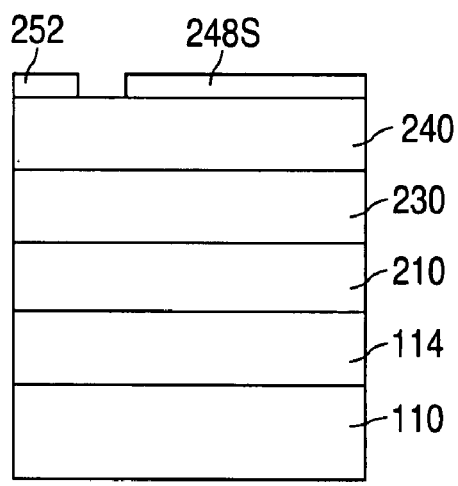
Figure 3A:
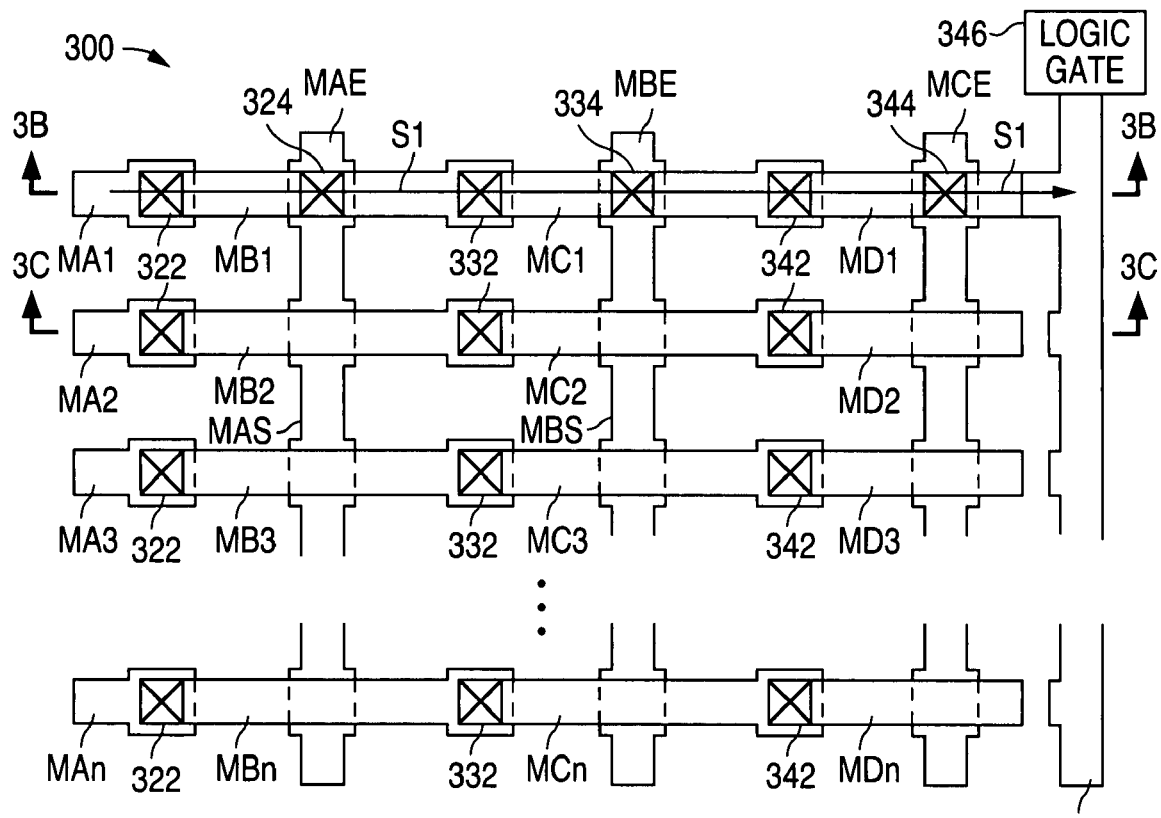
FIGS. 3A-3C are views illustrating an example of an edit structure 300 in accordance with the present invention.
Figure 3B:
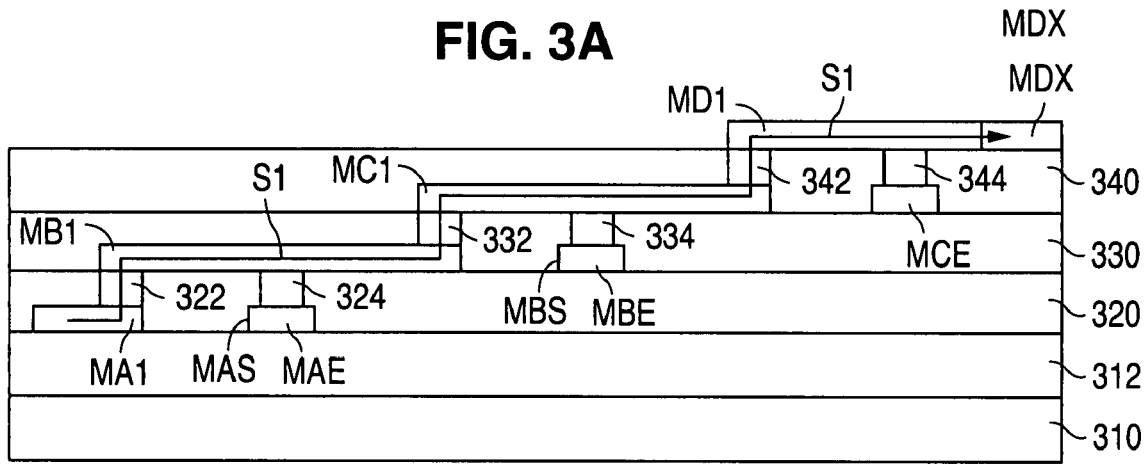
Figure 3C:
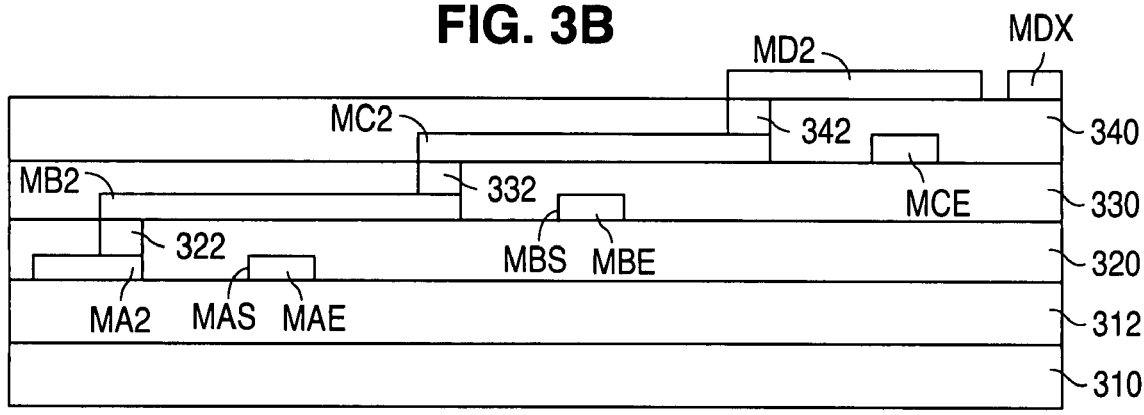

FIGS. 3A-3C show views that illustrate an example of an edit structure 300 in accordance with the present invention. FIG. 3A shows a plan view, while FIGS. 3B and 3C show cross-sectional views taken along lines 3B-3B and 3C-3C, respectively, of FIG. 3A. As described in greater detail below, although not limited to tie-in circuits, edit structure 300 allows the input of a logic gate to be changed by modifying only one of the metal or via masks used to form the metal interconnect structure.

For example, assume that, following the evaluation and testing of a semiconductor chip, one metal trace in the third metal layer and one tie-in circuit need to be modified to meet the operating specifications of the semiconductor chip. In accordance with the present invention, because edit structure 300 allows the input of the logic circuit to be modified by changing any one metal or via mask that is associated with the metal interconnect structure, both the metal trace and the logic gate input provided by the tie-in circuit can be modified by changing only the metal-3 mask that is associated with the third metal layer.

Thus, one of the advantages of the present invention is that the present invention provides the option to choose the metal or via mask that needs to be changed after the semiconductor chip has been fabricated. In the above example, the decision to modify the metal-3 mask to change the logic gate input provided by the tie-in circuit is made after the semiconductor chip has been fabricated and tested.

By contrast, if prior-art tie-in circuit 100 was utilized in the semiconductor chip, then two masks would have to be modified: the metal-1 mask would need to be modified to change the input provided by tie-in circuit 100, and the metal-3 mask would need to be modified to change the metal trace in the third metal layer. Thus, the present invention reduces the number of masks that must be changed to edit a semiconductor chip, thereby realizing a substantial cost savings.

As shown in FIGS. 3A-3C, edit structure 300 includes a semiconductor material 310, such as single-crystal silicon or a non-conductive region within the single-crystal silicon, and a first isolation layer 312 that touches the top surface of semiconductor material 310. Edit structure 300 also includes a number of metal-1 connection lines MA1-MAn and a metal-1 edit line MAE that touch the top surface of first isolation layer 312. Each metal-1 connection line MA1-MAn has a first end and an opposing second end. Further, a side wall MAS of metal-1 edit line MAE lies adjacent to and is spaced apart from the first end of each metal-1 connection line MA1-MAn.

As described in greater detail below, each metal-1 connection line MA is electrically connected to a corresponding underlying conductive structure, such as the end of a polysilicon resistor or the doped region of a transistor. Thus, the metal-1 connection lines MA1-MAn function as inputs to edit structure 300.

As further shown in FIGS. 3A-3C, edit structure 300 includes a second isolation layer 320 that touches the top surface of first isolation layer 312, and the top surfaces of the metal-1 connection lines MA1-MAn and metal-1 edit line MAE. Edit structure 300 further includes a number of metal-2 connection lines MB1-MBn and a metal-2 edit line MBE that touch the top surface of second isolation layer 320. Each metal-2 connection line MB1-MBn has a first end and an opposing second end. Further, a side wall MBS of metal-2 edit line MBE lies adjacent to and is spaced apart from the first end of each metal-2 connection line MB1-MBn.

In addition, edit structure 300 includes a number of first intermetal vias 322 that extend through second isolation layer 320 so that each metal-2 connection line MB makes an electrical connection with a corresponding metal-1 connection line MA. Further, edit structure 300 includes an edit via 324 that extends through second isolation layer 320 so that a metal-2 connection line MB makes an electrical connection with metal-1 edit line MAE. In edit structure 300, only one metal-2 connection line MB makes an electrical connection with metal-1 edit line MAE.

Edit structure 300 also includes a third isolation layer 330 that touches the top surface of second isolation layer 320, and the top surfaces of the metal-2 connection lines MB1-MBn and metal-2 edit line MBE. In addition, edit structure 300 includes a number of metal-3 connection lines MC1-MCn and a metal-3 edit line MCE that touch the top surface of third isolation layer 330.

Edit structure 300 further includes a number of second intermetal vias 332 that extend through third isolation layer 330 so that each metal-3 connection line MC makes an electrical connection with a corresponding metal-2 connection line MB. In addition, edit structure 300 includes an edit via 334 that extends through third isolation layer 330 so that a metal-3 connection line MC makes an electrical connection with metal-2 edit line MBE. In the present example, only one metal-3 connection line MC makes an electrical connection with metal-2 edit line MBE.

Edit structure 300 also includes a fourth isolation layer 340 that touches the top surface of third isolation layer 330, and the top surfaces of the metal-3 connection lines MC1-MCn and metal-3 edit line MCE. Further, edit structure 300 includes a number of metal-4 connection lines MD1-MDn and a metal-4 output line MDX that touch the top surface of fourth isolation layer 340.

In addition, edit structure 300 further includes a number of third intermetal vias 342 that extend through fourth isolation layer 340 so that each metal-4 connection line MD makes an electrical connection with a corresponding metal-3 connection line MC. Edit structure 300 also includes an edit via 344 that extends through fourth isolation layer 340 so that a metal-4 connection line MD makes an electrical connection with metal-3 edit line MCE. In the present example, only one metal-4 connection line MD makes an electrical connection with metal-3 edit line MCE. Metal-4 output line MDX, in turn, is connected to only one of the metal-4 connection lines MD1-MDn.

In the embodiment shown in FIGS. 3A-3C, a first signal path S1 extends through edit structure 300, beginning at the metal-1 (input) connection line MA1 and continuing through conductive via 322, metal-2 connection line MB1, conductive via 332, metal-3 connection line MC1, conductive via 342, metal-4 connection line MD1, and then to metal-4 output line MDX which is connected to the input of a logic gate 346. At this point, none of the other metal-1 (input) connection lines MA2-MAn have a signal path to metal-4 output line MDX.

In the FIGS. 3A-3C example, the metal-1 connection lines MA1-MAn, the metal-2 connection lines MB1-MBn, the metal-3 connection lines MC1-MCn, and the metal-4 connection lines MD1-MDn are substantially parallel, while the metal-1 edit line MAE, the metal-2 edit line MBE, and the metal-3 edit line MCE are substantially orthogonal to the metal-1 connection lines MA1-MAn.

Figure 4A:
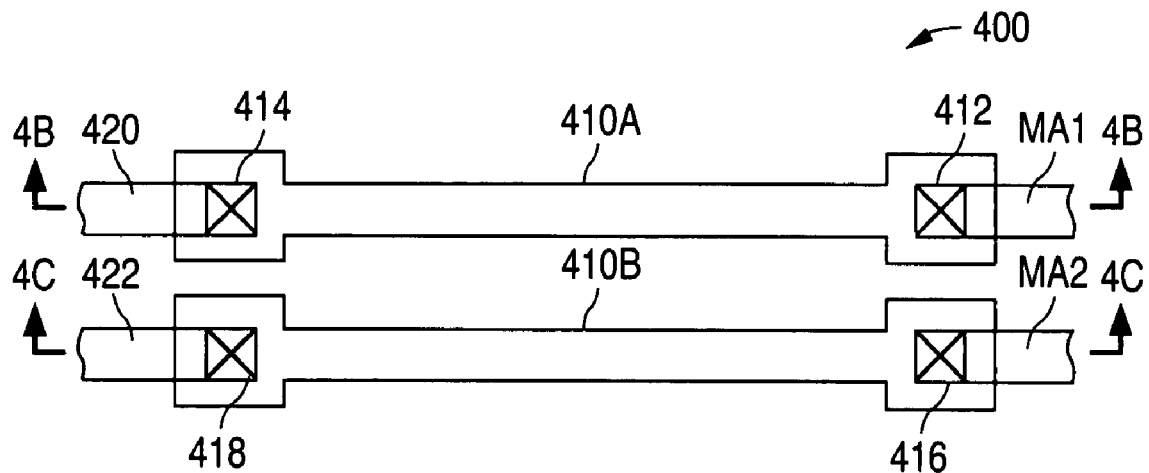
FIGS. 4A-4C are views illustrating an example of a tie-in circuit 400 in accordance with the present invention.
Figure 4B:
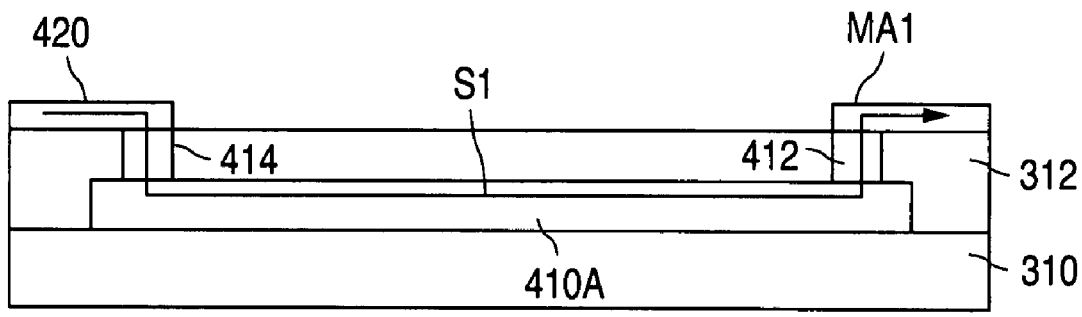
Figure 4C:
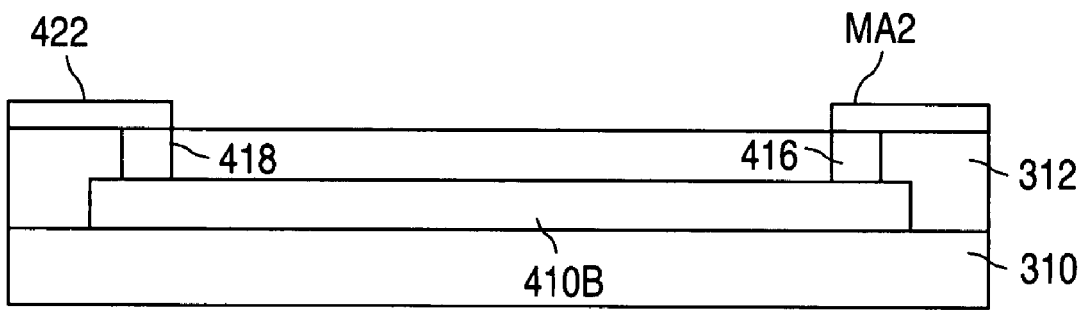

FIGS. 4A-4C show views that illustrate an example of a tie-in circuit 400 in accordance with the present invention. FIG. 4A shows a plan view, while FIGS. 4B and 4C show cross-sectional views taken along lines 4B-4B and 4C-4C, respectively, of FIG. 4A. As described in greater detail below, tie-in circuit 400 can be connected to edit structure 300 so that the logic state provided by tie-in circuit 400 can be changed by modifying any one metal or via mask.

As shown in FIGS. 4A-4C, tie-in circuit 400 includes a pair of spaced-apart polysilicon strips 410A and 410B that touch a non-conductive region of the top surface of semiconductor material 310. (A thin layer of gate oxide can also lie between the top surface of semiconductor material 310 and the polysilicon strips 410A and 410B.) As shown, first isolation layer 312 touches the top surfaces of the polysilicon strips 410A and 410B.

Tie-in circuit 400 also includes a first conductive contact 412 that extends through first isolation layer 312 to make an electrical connection to a first end of polysilicon strip 410A, and a second conductive contact 414 that extends through first isolation layer 312 to make an electrical connection to a second end of polysilicon strip 410A.

Further, tie-in circuit 400 includes a third conductive contact 416 that extends through first isolation layer 312 to make an electrical connection to a first end of polysilicon strip 410B, and a fourth conductive contact 418 that extends through first isolation layer 312 to make an electrical connection to a second end of polysilicon strip 410B.

As shown, metal-1 (input) connection line MA1 of edit structure 300 makes an electrical connection with first conductive contact 412, and metal-1 (input) connection line MA2 of edit structure 300 makes an electrical connection with third conductive contact 416. In the FIGS. 4A-4C example, a metal-1 power supply line 420 makes an electrical connection with second conductive contact 414, and a metal-1 ground line 422 makes an electrical connection with fourth conductive contact 418.

When edit structure 300 is connected to tie-in circuit 400 as described above, first signal path S1 also extends from power supply line 420 through second conductive contact 414, first polysilicon strip 410A, first conductive contact 412 and out to metal-1 (input) connection line MA1 of edit structure 300. Since first signal path S1 extends from power supply line 420 to metal-4 output line MDX, which is connected to the input of logic gate 346, the first signal path S1 defines tie-in circuit 400 as a "tie-high" circuit.

As noted above, during the testing and evaluation of a semiconductor chip, it is often necessary to modify one of the logic circuits by changing the logic state that is permanently applied to the input of a logic gate. In accordance with the present invention, the logic state that is permanently applied to the input of a logic gate, such as logic gate 346, can be changed in any one metal or via mask by using edit structure 300.

Figure 5A:
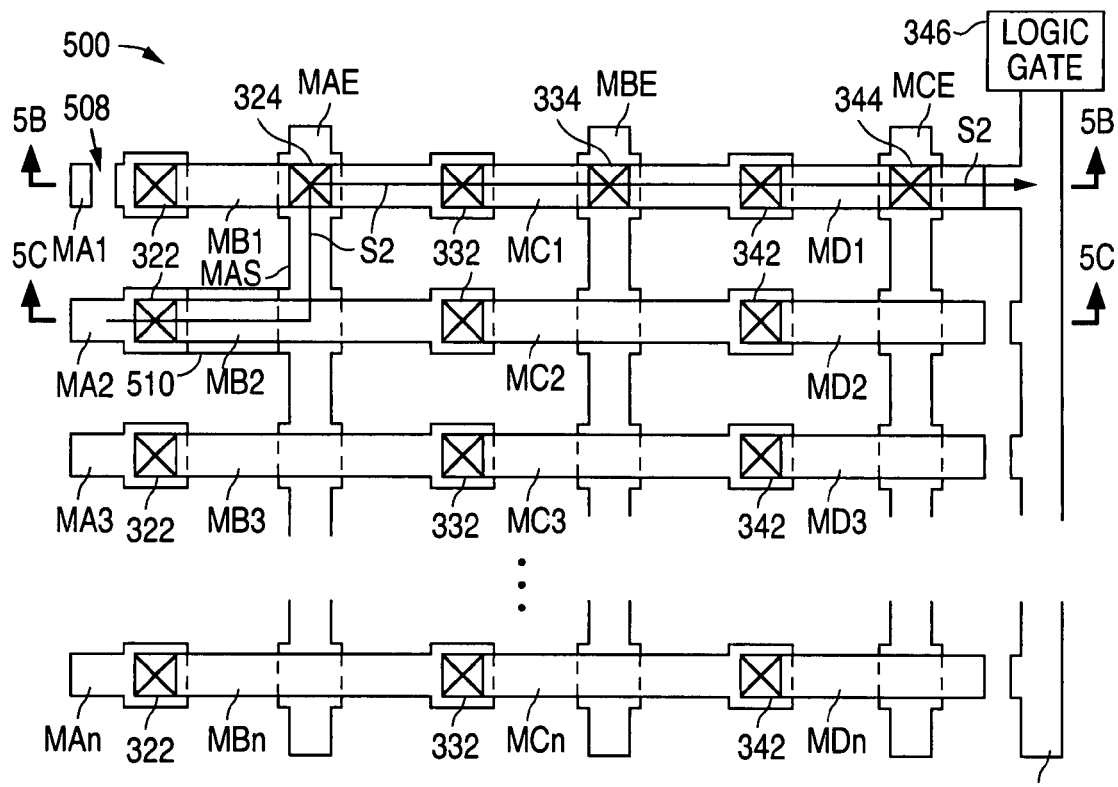
FIGS. 5A-5C are views illustrating an example of an edit circuit 500 in accordance with the present invention.
Figure 5B:
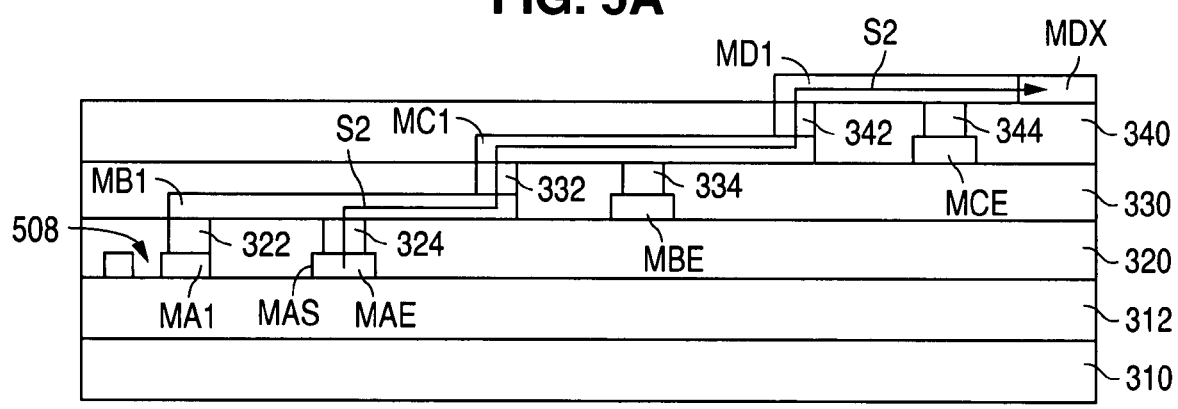
Figure 5C:
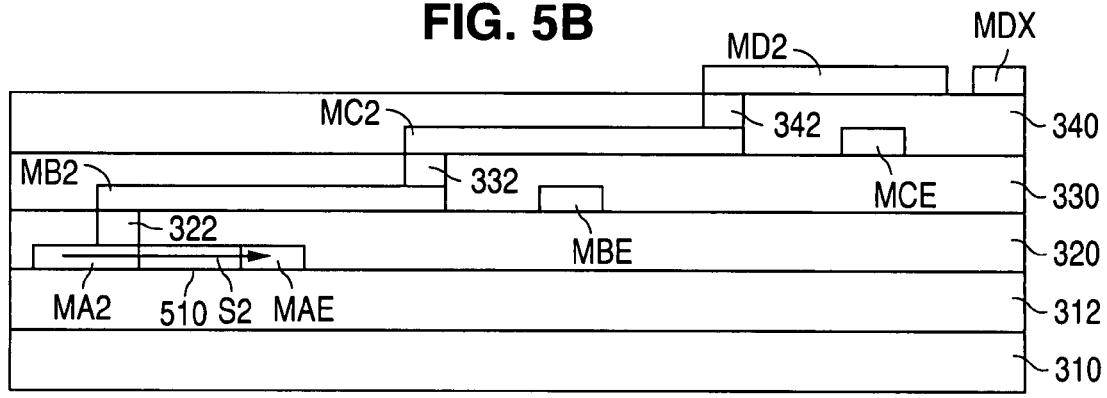

FIGS. 5A-5C show views illustrating an example of an edit circuit 500 in accordance with the present invention. FIG. 5A shows a plan view, while FIGS. 5B and 5C show cross-sectional views taken along lines 5B-5B and 5C-5C, respectively, of FIG. 5A. FIGS. 5A-5C illustrate a modification of edit structure 300 by way of the metal-1 mask to change the logic state placed on the input of logic gate 346 from a permanent logic high to a permanent logic low, assuming that tie-in circuit 400 is connected as described above.

As shown in FIGS. 5A-5C, a section of metal-1 connection line MA1 has been removed to form an opening 508 that lies between the first end and the opposing second end of metal-1 connection line MA1 to electrically isolate the first end from the opposing second end of metal-1 connection line MA1. In addition, a metal-1 section 510 has been added so that the first end of metal-1 connection line MA2 is connected to side wall MAS of metal-1 edit line MAE.

In the present example, no other metal-1 connection line MA is connected to metal-1 edit line MAE. As a result, a second signal path 52 extends through edit structure 300, beginning at the metal-1 (input) connection line MA2 and continuing through the metal-1 section 510, metal-1 edit line MAE, conductive via 324, metal-2 connection line MB1, conductive via 332, metal-3 connection line MC1, conductive via 342, metal-4 connection line MD1, and then to metal-4 output line MDX which is connected to the input of logic gate 346. At this point, none of the other metal-1 input lines MA1 and MA3-MAn have a signal path to metal-4 output line MDX. Thus, by changing only the metal-1 mask, the logic state permanently placed on the input of logic gate 346 was changed from high to low.

Figure 6A:
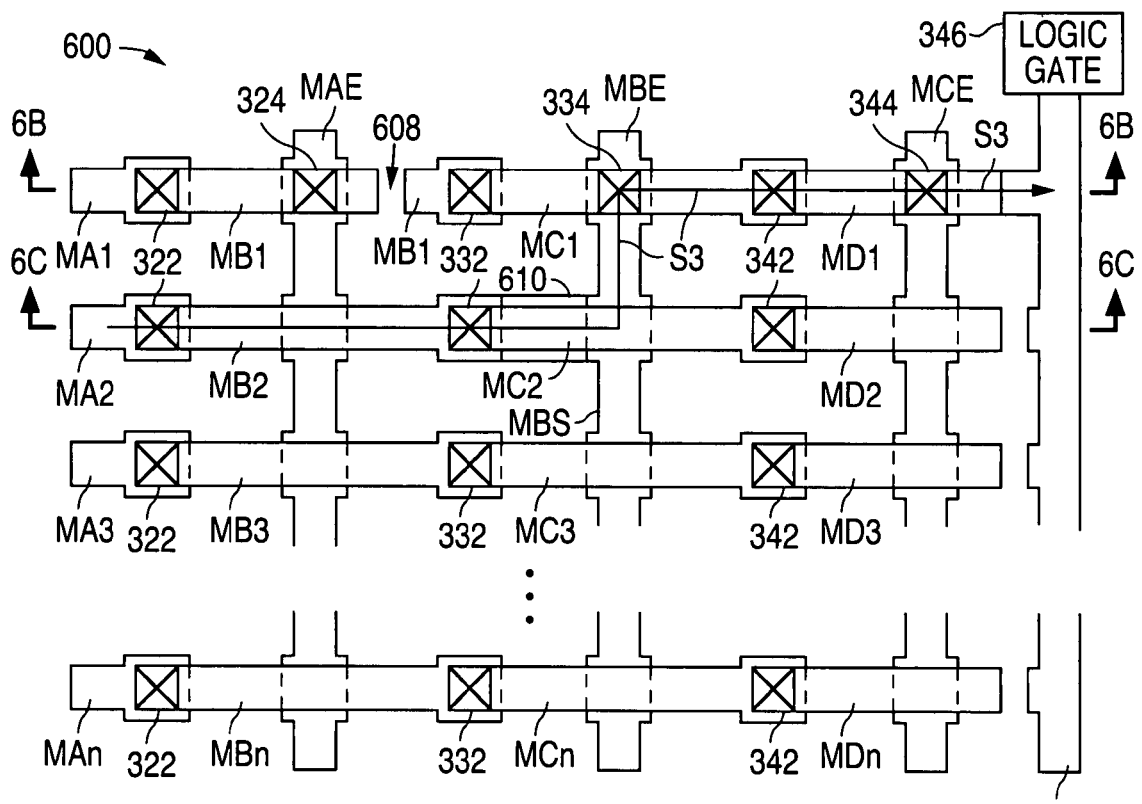
FIGS. 6A-6C are views illustrating an example of an edit circuit 600 in accordance with the present invention.
Figure 6B:
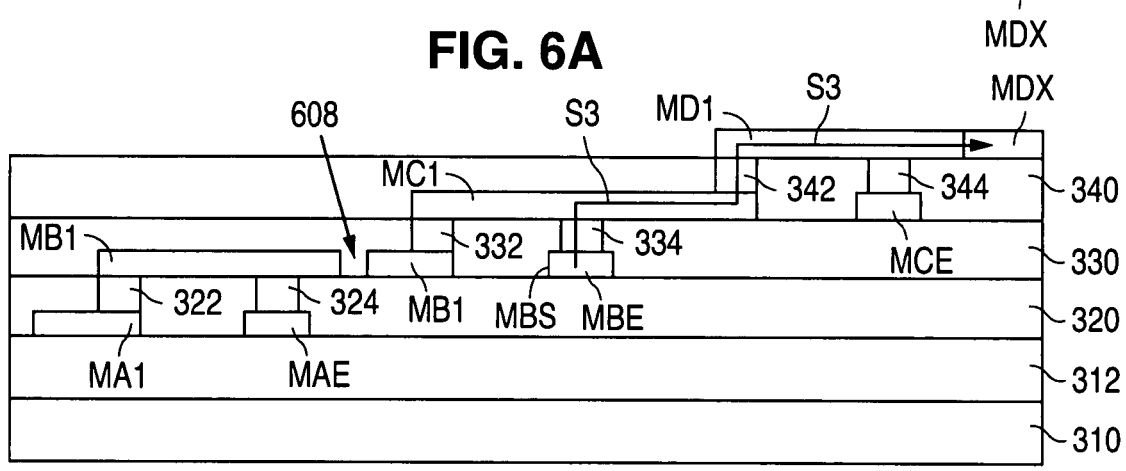
Figure 6C:
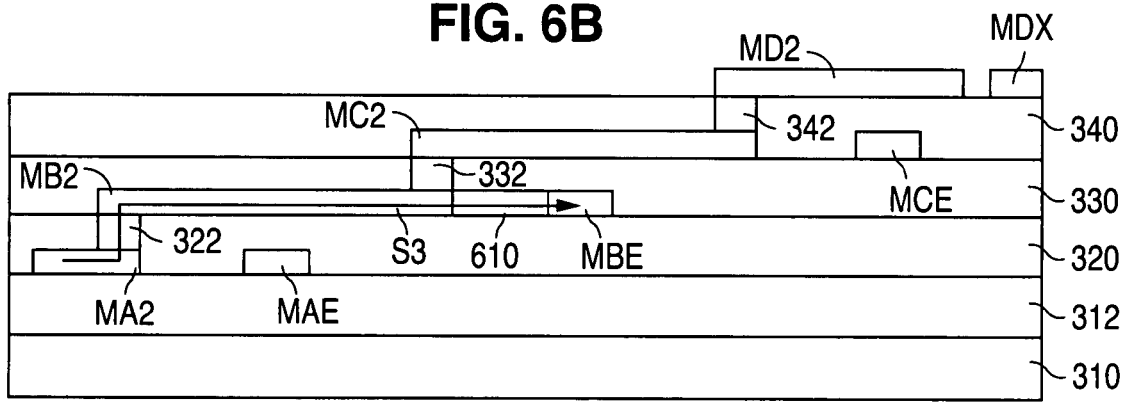

FIGS. 6A-6C show views illustrating an example of an edit circuit 600 in accordance with the present invention. FIG. 6A shows a plan view, while FIGS. 6B and 6C show cross-sectional views taken along lines 6B-6B and 6C-6C, respectively, of FIG. 6A. FIGS. 6A-6C illustrate a modification of edit structure 300 by way of the metal-2 mask to change the logic state placed on the input of logic gate 346 from a permanent logic high to a permanent logic low, assuming that tie-in circuit 400 is connected as described above.

As shown in FIGS. 6A-6C, a section of metal-2 connection line MB1 has been removed to form an opening 608 that lies between the first end and the opposing second end of metal-2 connection line MB1 to electrically isolate the first end from the opposing second end of metal-2 connection line MB1. In addition, a metal-2 section 610 has been added so that the first end of metal-2 connection line MB2 is connected to side wall MBS of metal-2 edit line MBE.

In the present example, no other metal-2 connection line MB is connected to metal-2 edit line MBE. As a result, a third signal path S3 extends through edit structure 300, beginning at the metal-1 (input) connection line MA2 and continuing through conductive via 322, metal-2 connection line MB2, metal-2 section 610, metal-2 edit line MBE, conductive via 334, metal-3 connection line MC1, conductive via 342, metal-4 connection line MD1, and then to metal-4 output line MDX which is connected to the input of a logic gate 346. At this point, none of the other metal-1 input lines MA1 and MA3-MAn have a signal path to metal-4 output line MDX. Thus, by changing only the metal-2 mask, the logic state permanently placed on the input of logic gate 346 was changed from high to low.

Figure 7A:
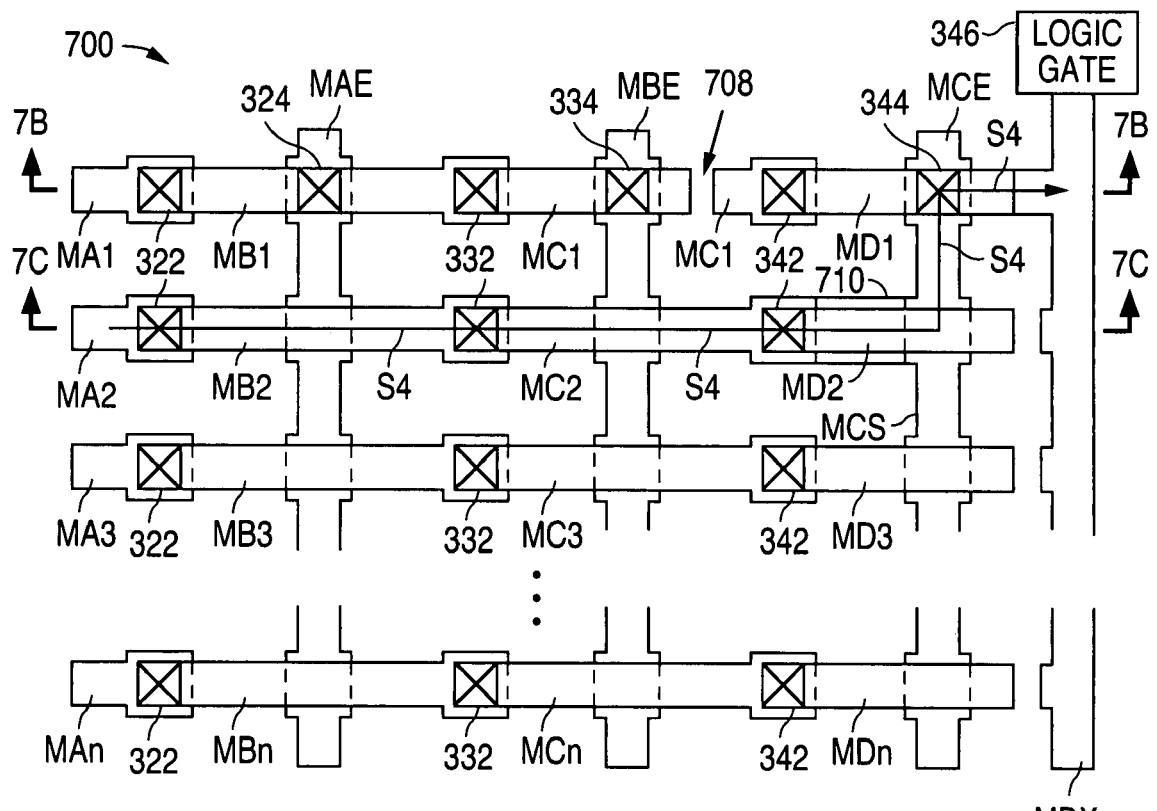
FIGS. 7A-7C are views illustrating an example of an edit circuit 700 in accordance with the present invention.
Figure 7B:
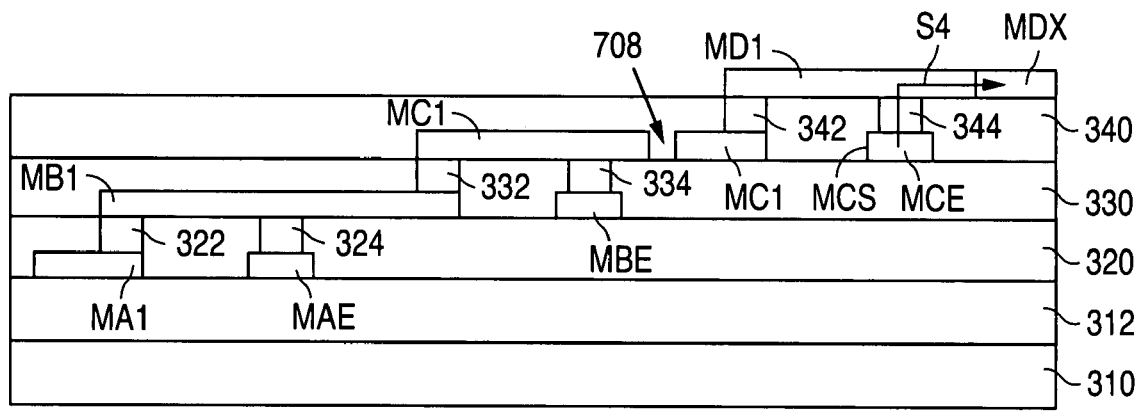
Figure 7C:
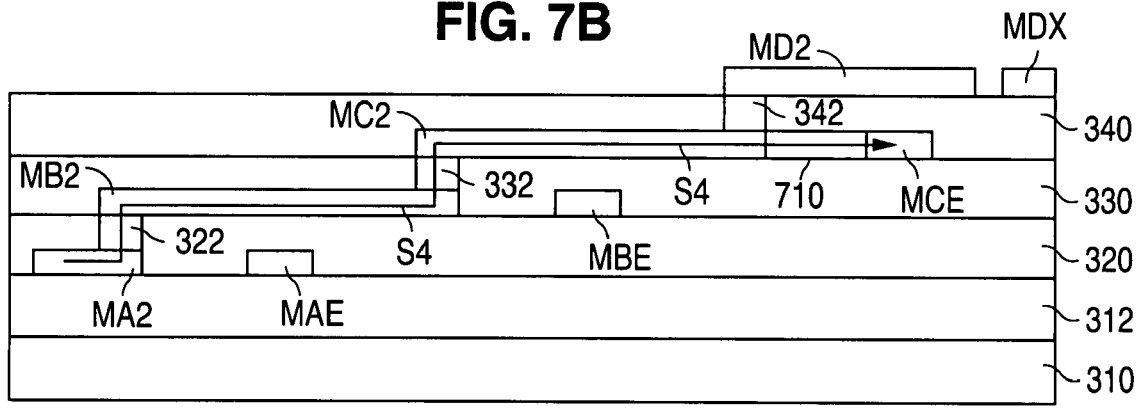

FIGS. 7A-7C show views illustrating an example of an edit circuit 700 in accordance with the present invention. FIG. 7A shows a plan view, while FIGS. 7B and 7C show cross-sectional views taken along lines 7B-7B and 7C-7C, respectively, of FIG. 7A. FIGS. 7A-7C illustrate a modification of edit structure 300 by way of the metal-3 mask to change the logic state placed on the input of logic gate 346 from a permanent logic high to a permanent logic low, assuming that tie-in circuit 400 is connected as described above.

As shown in FIGS. 7A-7C, a section of metal-3 connection line MC1 has been removed to form an opening 708 that lies between the first end and the opposing second end of metal-3 connection line MC1 to electrically isolate the first end from the opposing second end of metal-3 connection line MC1. In addition, a metal-3 section 710 has been added so that the first end of metal-3 connection line MC2 is connected to a side wall MCS of metal-3 edit line MCE.

In the present example, no other metal-3 connection line MC is connected to metal-3 edit line MCE. As a result, a fourth signal path S4 extends through edit structure 300, beginning at the metal-1 (input) connection line MA2 and continuing through conductive via 322, metal-2 connection line MB2, conductive via 332, metal-3 connection line MC2, metal-3 section 710, metal-3 edit line MCE, conductive via 344, metal-4 connection line MD1, and then to metal-4 output line MDX which is connected to the input of a logic gate 346. At this point, none of the other metal-1 (input) connection lines MA1 and MA3-MAn have a signal path to metal-4 output line MDX. Thus, by changing only the metal-3 mask, the logic state permanently placed on the input of logic gate 346 was changed from high to low.

Figure 8A:
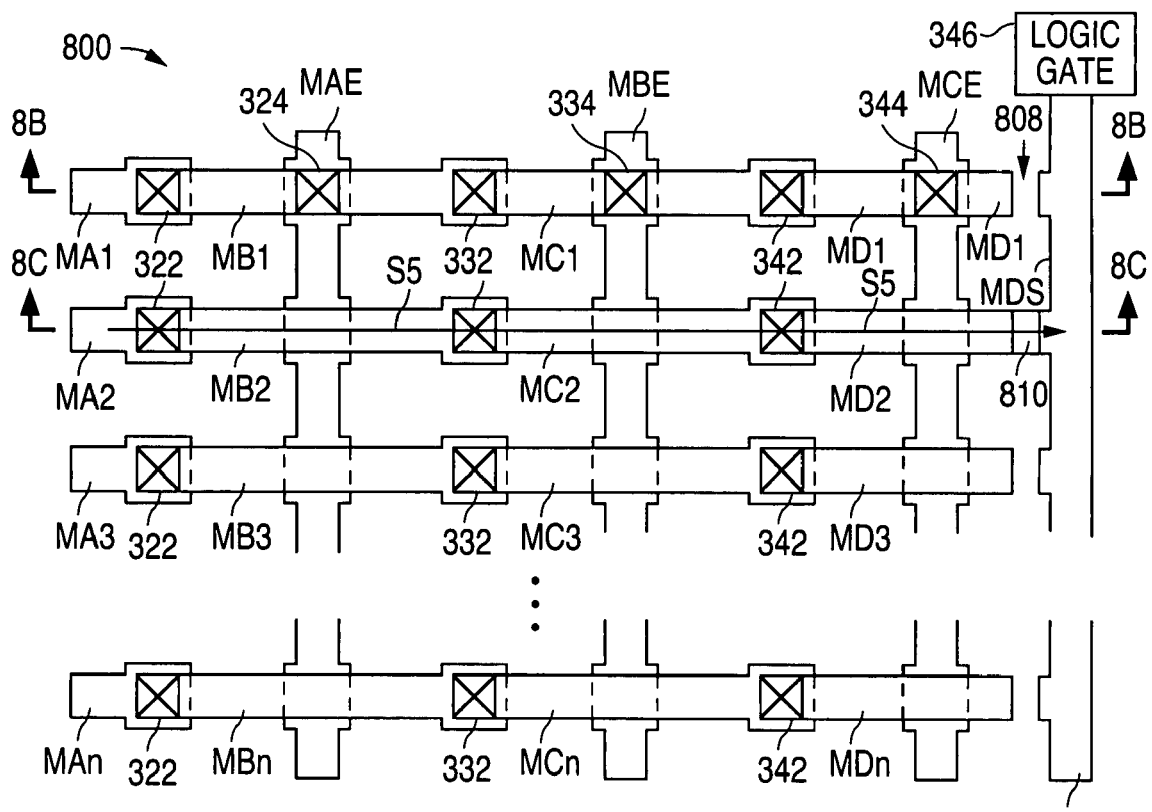
FIGS. 8A-8C are views illustrating an example of an edit circuit 800 in accordance with the present invention.
Figure 8B:
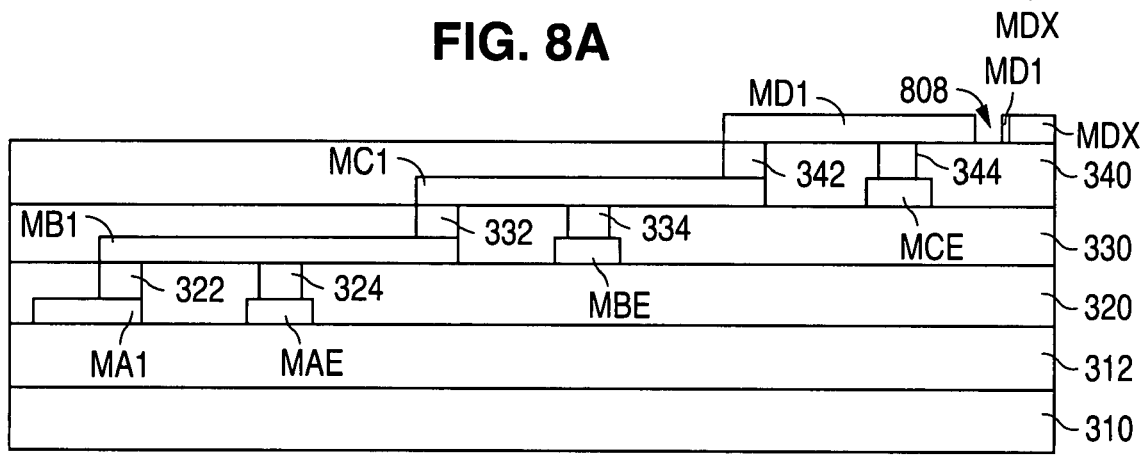
Figure 8C:
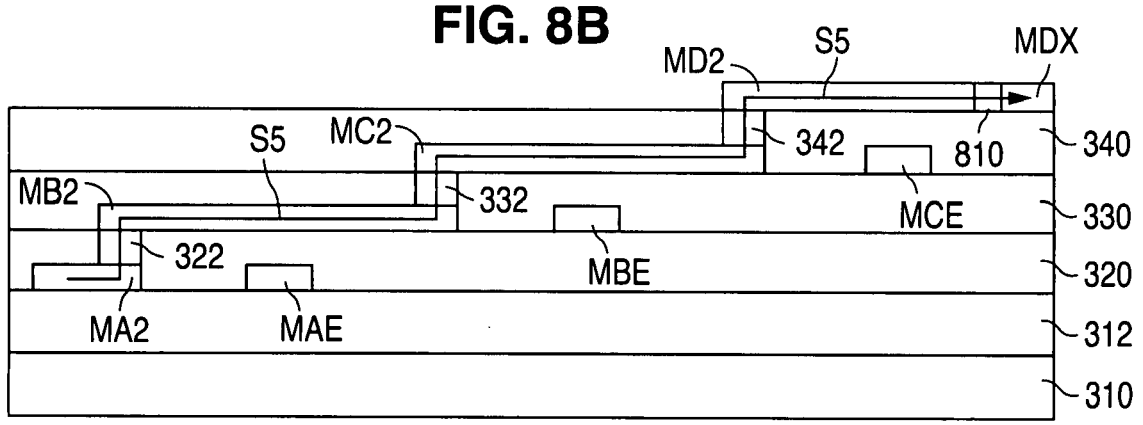

FIGS. 8A-8C show views illustrating an example of an edit circuit 800 in accordance with the present invention. FIG. 8A shows a plan view, while FIGS. 8B and 8C show cross-sectional views taken along lines 8B-8B and 8C-8C, respectively, of FIG. 8A. FIGS. 8A-8C illustrate a modification of edit structure 300 by way of the metal-4 mask to change the logic state placed on the input of logic gate 346 from a permanent logic high to a permanent logic low, assuming that tie-in circuit 400 is connected as described above.

As shown in FIGS. 8A-8C, a section of metal-4 connection line MD1 has been removed to form an opening 808 that lies between the first end and the opposing second end of metal-4 connection line MD1 to electrically isolate the first end from the opposing second end of metal-4 connection line MD1. In addition, a metal-4 section 810 has been added so that the first end of metal-4 connection line MD2 is connected to a side wall MDS of metal-4 output line MDX.

In the present example, no other metal-4 connection line MD is connected to metal-4 output line MDX. As a result, a fifth signal path S5 extends through edit structure 300, beginning at the metal-1 (input) connection line MA2 and continuing through conductive via 322, metal-2 connection line MB2, conductive via 332, metal-3 connection line MC2, conductive via 342, metal-4 connection line MD2, and then to metal-4 output line MDX which is connected to the input of logic gate 346. At this point, none of the other metal-1 (input) connection lines MA1 and MA3-MAn have a signal path to metal-4 output line MDX. Thus, by changing only the metal-4 mask, the logic state permanently placed on the input of logic gate 346 was changed from high to low.

Figure 9A:
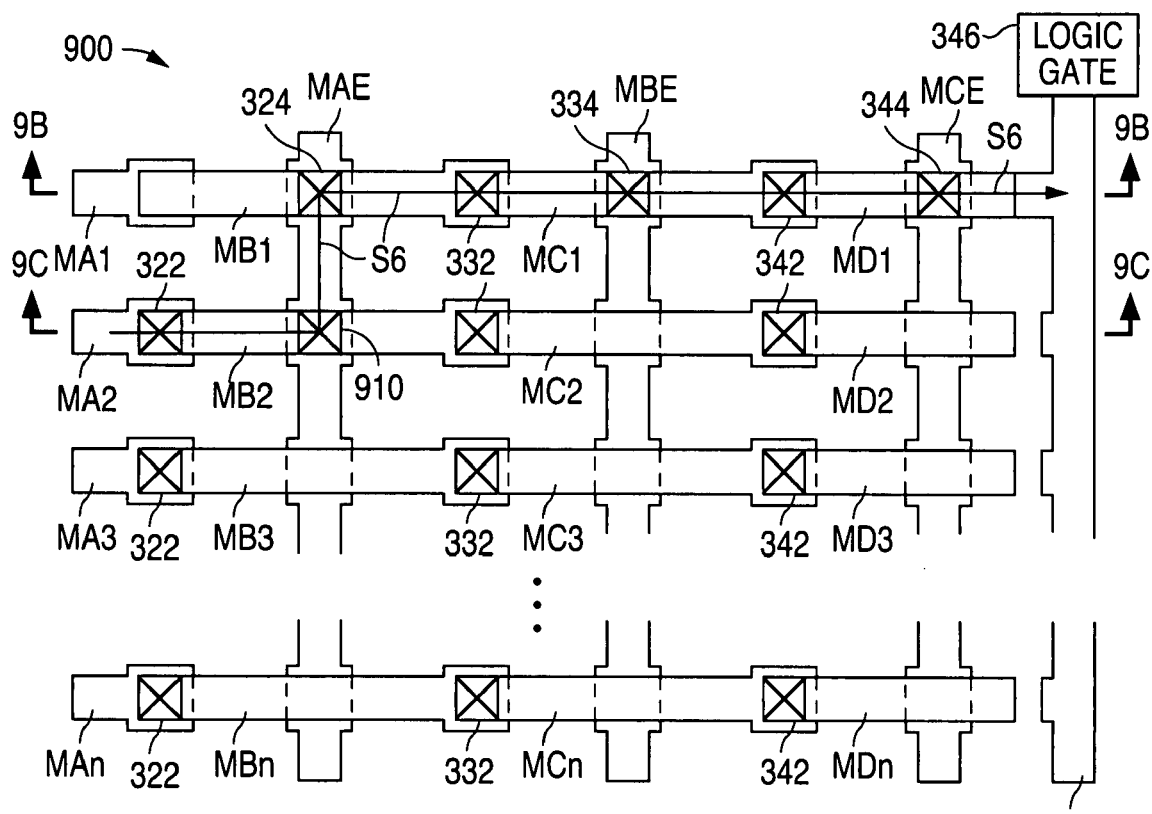
FIGS. 9A-9C are views illustrating an example of an edit circuit 900 in accordance with the present invention.
Figure 9B:
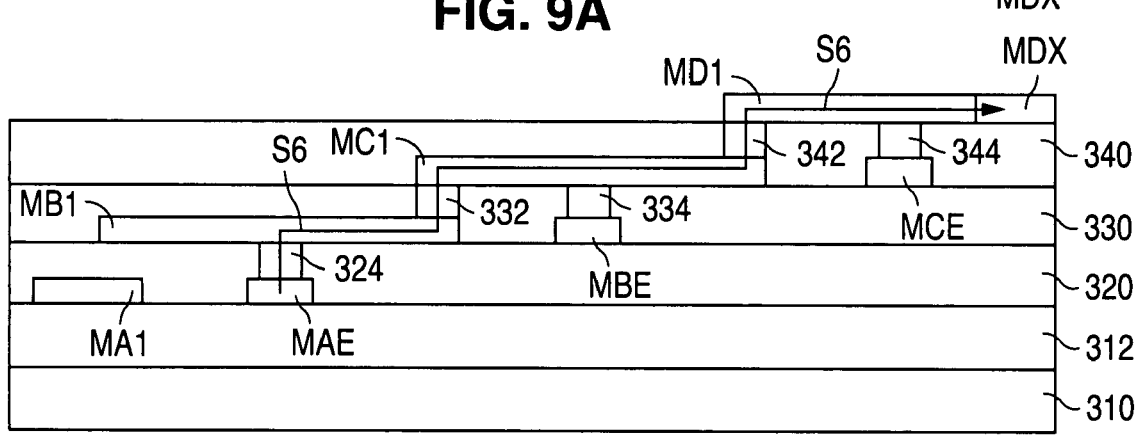
Figure 9C:
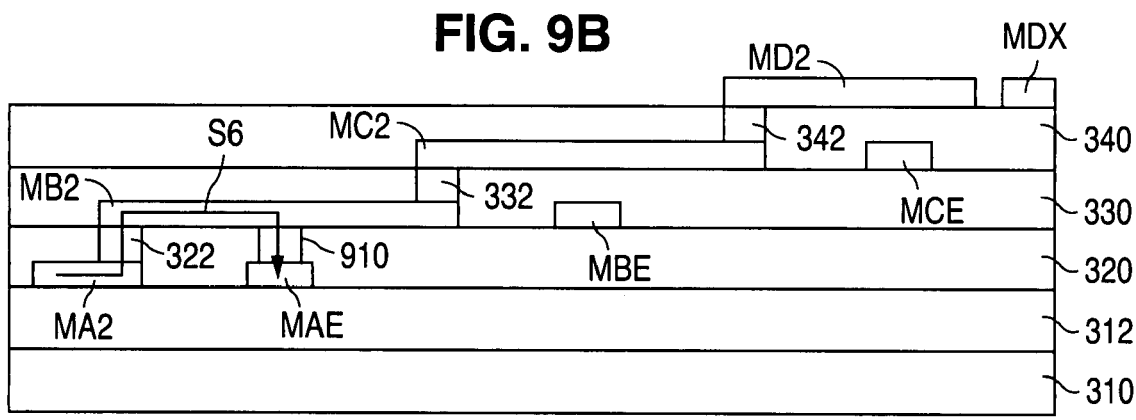

FIGS. 9A-9C show views illustrating an example of an edit circuit 900 in accordance with the present invention. FIG. 9A shows a plan view, while FIGS. 9B and 9C show cross-sectional views taken along lines 9B-9B and 9C-9C, respectively, of FIG. 9A. FIGS. 9A-9C illustrate a modification of edit structure 300 by way of the first via mask to change the logic state placed on the input of logic gate 346 from a permanent logic high to a permanent logic low, assuming that tie-in circuit 400 is connected as described above.

As shown in FIGS. 9A-9C, conductive via 322 connected between metal-1 connection line MA1 and metal-2 connection line MB1 has been removed, while a conductive via 910 has been added so that metal-2 connection line MB2 is connected to metal-1 edit line MAE. As a result, a sixth signal path S6 extends through edit structure 300, beginning at the metal-1 (input) connection line MA2 and continuing through conductive via 322, metal-2 connection line MB2, conductive via 910, metal-1 edit line MAE, conductive via 324, metal-2 connection line MB1, conductive via 332, metal-3 connection line MC1, conductive via 342, metal-4 connection line MD1, and then to metal-4 output line MDX which is connected to the input of logic gate 346. At this point, none of the other metal-1 (input) connection lines MA1 and MA3-MAn have a signal path to metal-4 output line MDX. Thus, by changing only the first via mask, the logic state permanently placed on the input of logic gate 346 was changed from high to low.

Figure 10A:
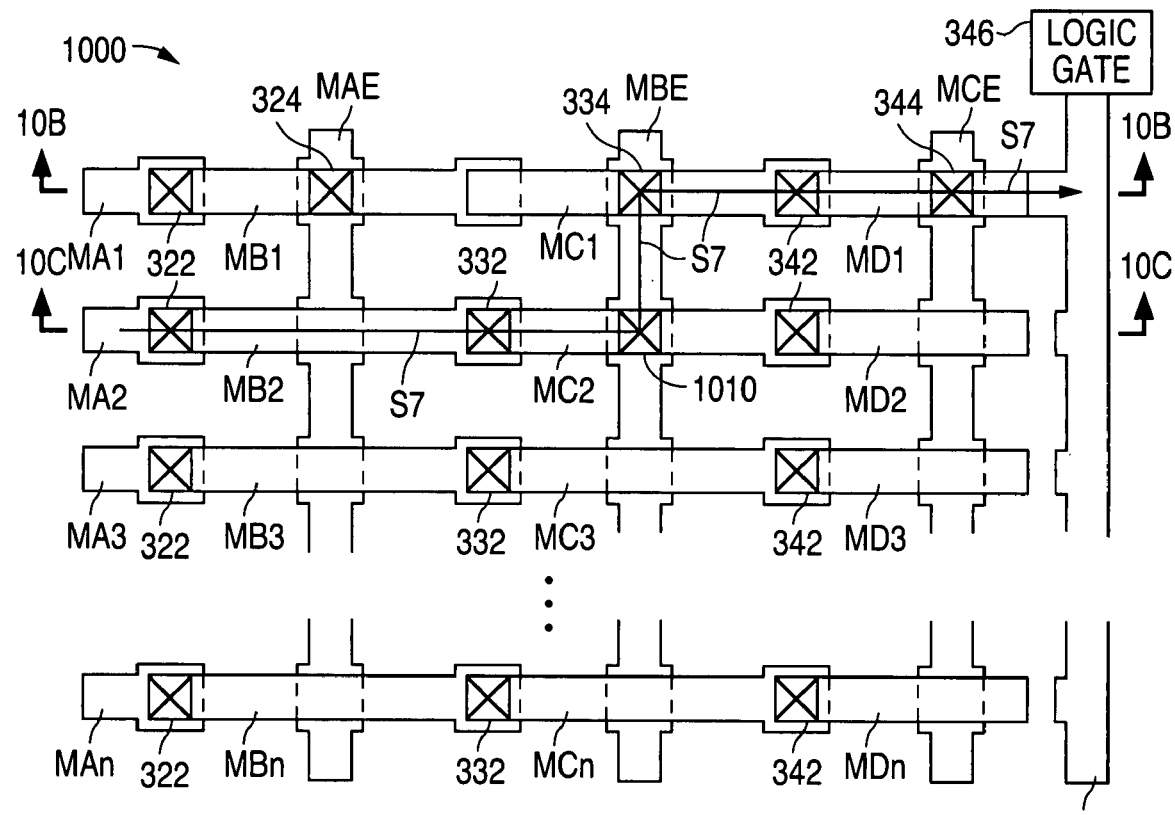
FIGS. 10A-10C are views illustrating an example of an edit circuit 1000 in accordance with the present invention.
Figure 10B:
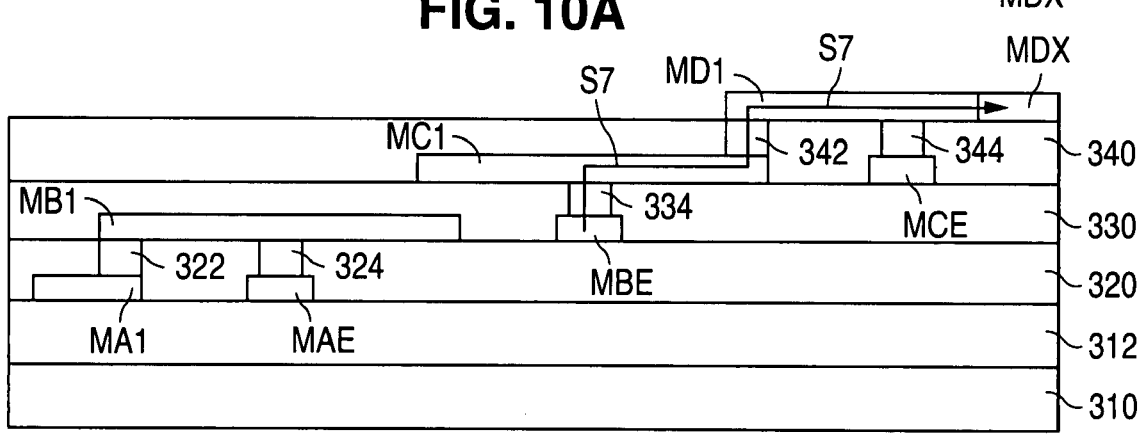
Figure 10C:
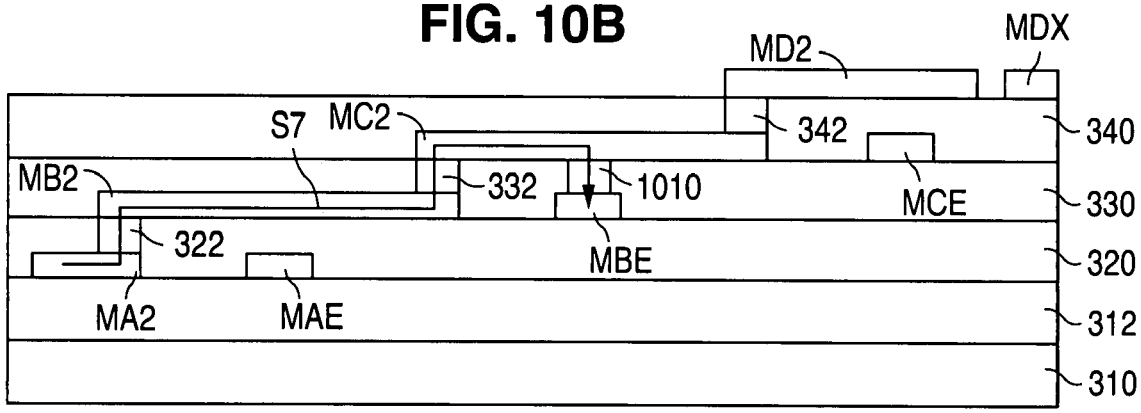

FIGS. 10A-10C show views illustrating an example of an edit circuit 1000 in accordance with the present invention. FIG. 10A shows a plan view, while FIGS. 10B and 10C show cross-sectional views taken along lines 10B-10B and 10C-10C, respectively, of FIG. 10A. FIGS. 10A-10C illustrate a modification of edit structure 300 by way of the second via mask to change the logic state placed on the input of logic gate 346 from a permanent logic high to a permanent logic low, assuming that tie-in circuit 400 is connected as described above.

As shown in FIGS. 10A-10C, conductive via 332 connected between metal-2 connection line MB1 and metal-3 connection line MC1 has been removed, while a conductive via 1010 has been added so that metal-3 connection line MC2 is connected to metal-2 edit line MBE. As a result, a seventh signal path S7 extends through edit structure 300, beginning at the metal-1 (input) connection line MA2 and continuing through conductive via 322, metal-2 connection line MB2, conductive via 332, metal-3 connection line MC2, conductive via 1010, metal-2 edit line MBE, conductive via 334, metal-3 connection line MC1, conductive via 342, metal-4 connection line MD1, and then to metal-4 output line MDX which is connected to the input of logic gate 346. At this point, none of the other metal-1 (input) connection lines MA1 and MA3-MAn have a signal path to metal-4 output line MDX. Thus, by changing only the second via mask, the logic state permanently placed on the input of logic gate 346 was changed from high to low.

Figure 11A:
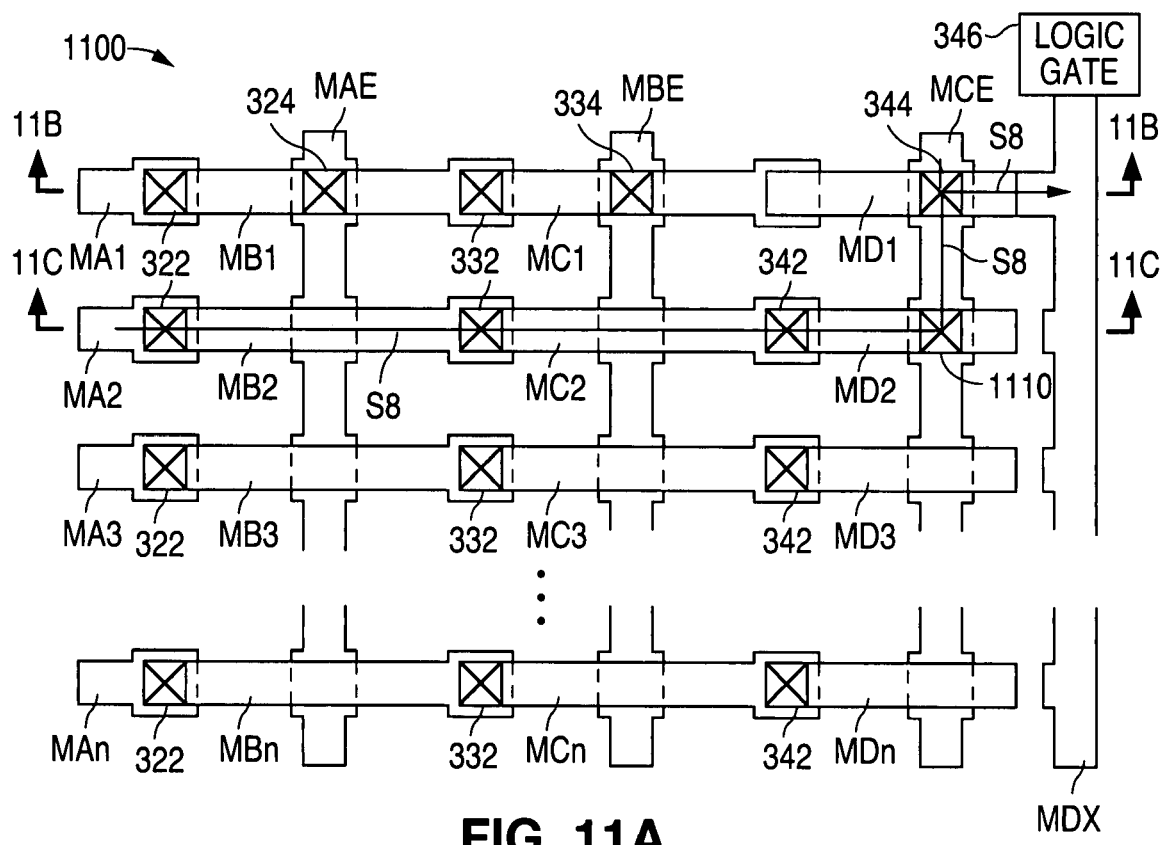
FIGS. 11A-11C are views illustrating an example of an edit circuit 1100 in accordance with the present invention.
Figure 11B:
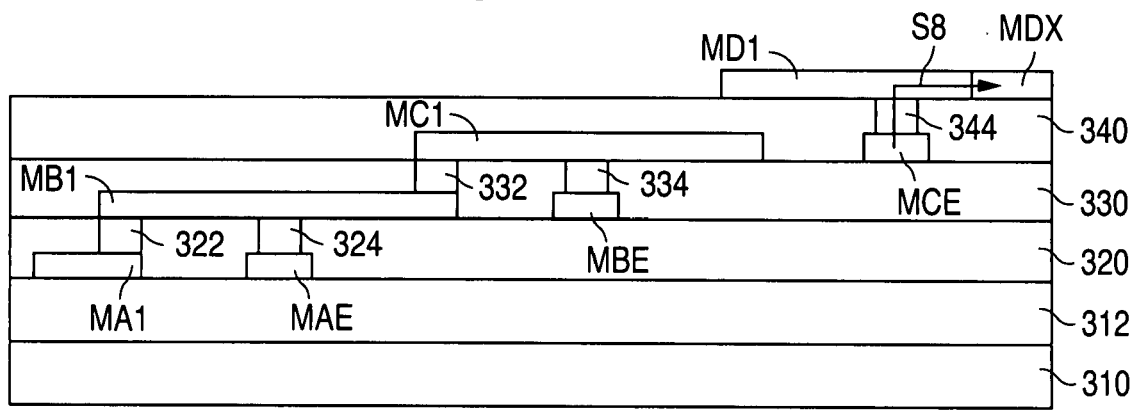
Figure 11C:
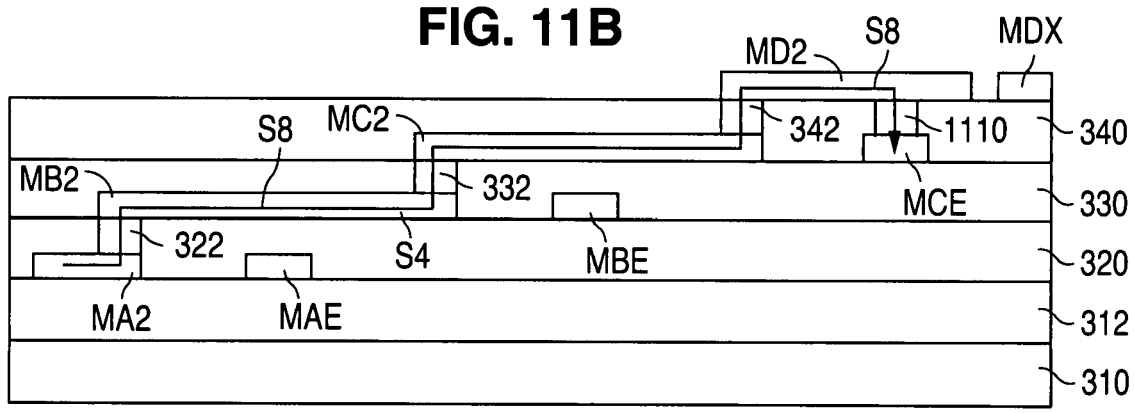

FIGS. 11A-11C show views that illustrate an example of an edit circuit 1100 in accordance with the present invention. FIG. 11A shows a plan view, while FIGS. 11B and 11C show cross-sectional views taken along lines 11B-11B and 11C-11C of FIG. 11A. FIGS. 11A-11C illustrate a modification of edit structure 300 by way of the third via mask to change the logic state placed on the input of logic gate 346 from a permanent logic high to a permanent logic low, assuming that tie-in circuit 400 is connected as described above.

As shown in FIGS. 11A-11C, conductive via 342 connected between metal-3 connection line MC1 and metal-4 connection line MD1 has been removed, while a conductive via 1110 has been added so that metal-4 connection line MD2 is connected to metal-3 edit line MCE. As a result, an eighth signal path S8 extends through edit structure 300, beginning at the metal-1 (input) connection line MA2 and continuing through conductive via 322, metal-2 connection line MB2, conductive via 332, metal-3 connection line MC2, conductive via 342, metal-4 connection line MD2, conductive via 1110, metal-3 edit line MCE, conductive via 344, metal-4 connection line MD1, and then to metal-4 output line MDX which is connected to the input of a logic gate 346. At this point, none of the other metal-1 (input) connection lines MA1 and MA3-MAn have a signal path to metal-4 output line MDX. Thus, by changing only the third via mask, the logic state permanently placed on the input of logic gate 346 was changed from high to low.

Figure 12A:
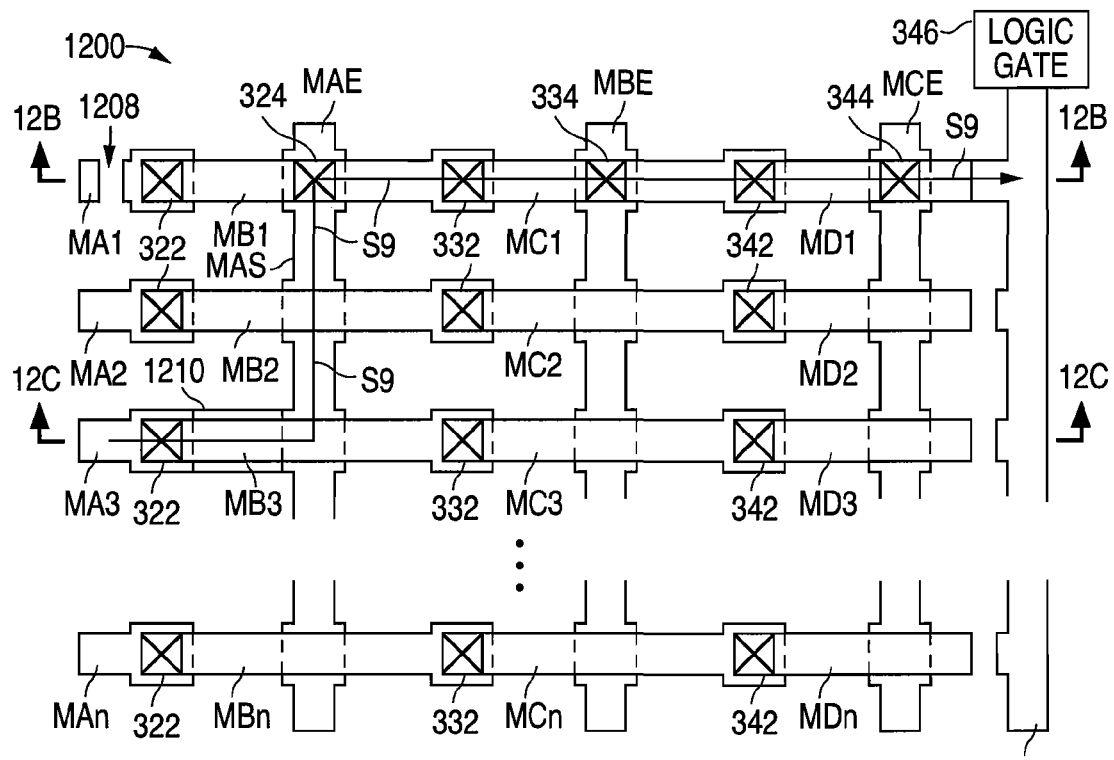
FIGS. 12A-12C are views illustrating an example of an edit circuit 1200 in accordance with the present invention.
Figure 12B:
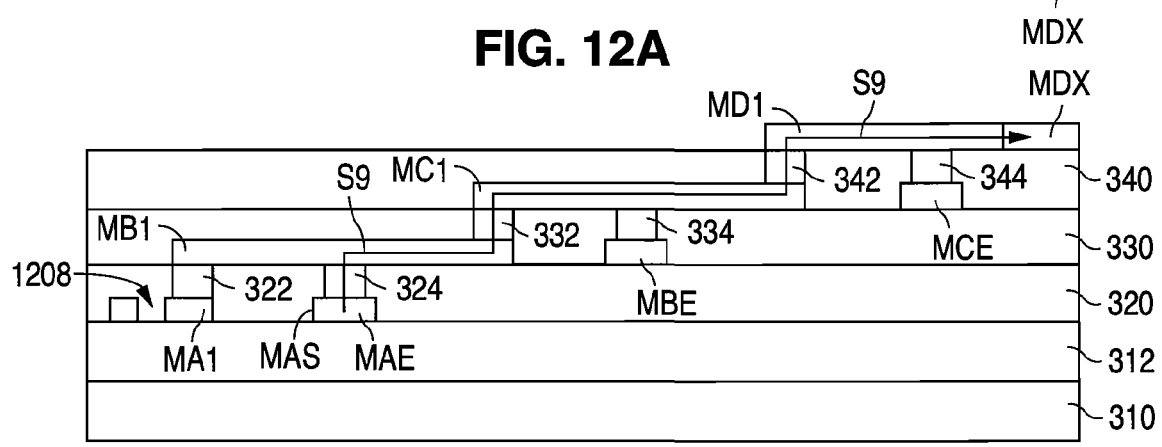
Figure 12C:
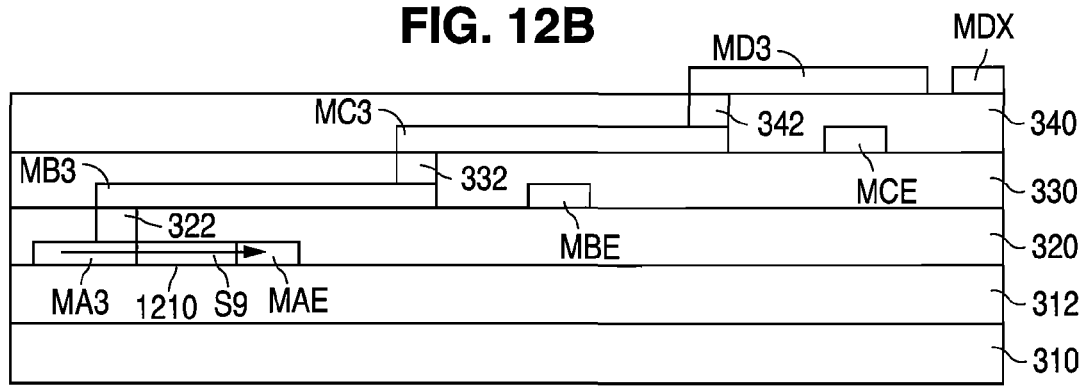

FIGS. 12A-12C show views illustrating an example of an edit circuit 1200 in accordance with the present invention. FIG. 12A shows a plan view, while FIGS. 12B and 12C show cross-sectional views taken along lines 12B-12B and 12C-12C of FIG. 12A. FIGS. 12A-12C illustrate a modification of edit structure 300 by way of the first metal mask to change the input of logic gate 346 from a permanent logic high to a time varying signal, such as a clock signal that is present on metal-1 (input) connection line MA3.

As shown in FIGS. 12A-12C, a section of metal-1 connection line MA1 has been removed to form an opening 1208 that lies between the first end and the opposing second end of metal-1 connection line MA1 to electrically isolate the first end from the opposing second end of metal-1 connection line MA1. In addition, a metal-1 section 1210 has been added so that the first end of metal-1 connection line MA3 is connected to a side wall MAS of metal-1 edit line MAE.

In the present example, no other metal-1 connection line MA is connected to metal-1 edit line MAE. As a result, a ninth signal path S9 extends through edit structure 300, beginning at the metal-1 (input) connection line MA3 and continuing through the metal-1 section 1210, metal-1 edit line MAE, conductive via 324, metal-2 connection line MB1, conductive via 332, metal-3 connection line MC1, conductive via 342, metal-4 connection line MD1, and then to metal-4 output line MDX which is connected to the input of logic gate 346. At this point, none of the other metal-1 (input) connection lines MA1-MA2 and MA4-MAn have a signal path to metal-4 output line MDX. Thus, by changing only the metal-1 mask, the input of logic gate 346 was changed from a permanent logic high to a time varying signal.

As noted above, edit structure 300 is not limited to changing a permanent logic state provided by a tie-in circuit. Instead, edit structure 300 allows the input of a logic gate to be changed from any signal (whether permanent or time varying) to any other signal (whether permanent or time varying) by changing only one metal mask. (Although only the metal-1 mask was changed in the FIGS. 12A-12C example, any one of the other metal masks and via masks can be modified in the same manner as described above to change the input of the logic gate to a time varying signal.) Thus, the present invention reduces the number of masks that must be changed when a semiconductor circuit is edited.

In addition, edit structure 300 can also be used to select one of a number of outputs provided by a resistor or capacitor circuit which, in turn, is provided as the input to a circuit element, such as a logic gate or a transistor. For example, assume that two resistors are connected in series, the input of the first resistor is connected to metal-1 (input) connection line MA1, the input of the second resistor is connected to metal-1 (input) connection line MA2, and the output of the second resistor is connected to metal-1 (input) connection line MA3. By changing the metal-1 (input) connection line MA that has a signal path to metal-4 output line MDX, the resistor value input to the circuit element can be changed. Thus, a resistor or capacitor leg could be bypassed or stitched in with a single mask edit.

FIGS. 13A-16A and FIGS. 13B-16B show views that illustrate an example of a method 1300 of forming an edit structure in accordance with the present invention. FIGS. 13A-16A show plan views, while FIGS. 13B-16B show cross-sectional views taken along line 13B-13B through line 16B-16B, respectively, of FIGS. 13A-16A.

As shown in FIGS. 13A-13B, method 1300 begins by forming a first isolation layer 1310, followed by the formation of a first-metal layer 1312 on first isolation layer 1310. First-metal layer 1312 can be used to form, for example, a metal-1 layer, a metal-2 layer, or a metal-3 layer. Following this, method 1300 continues by forming a mask 1314 on first-metal layer 1312. Next, the regions of first-metal layer 1312 that are exposed by mask 1314 are etched away and removed. Mask 1314 is then removed.

As shown in FIGS. 14A-14B, the etch forms a number of first-metal connection lines CL1-CLn and a first-metal edit line EL. Each first-metal connection line CL1-CLn has a first end and an opposing second end. As further shown, a sidewall ELS of first-metal edit line EL lies adjacent to the first end of each of the first-metal connection lines CL1-CLn.

Following this, as shown in FIGS. 15A-15B, a second isolation layer 1320 is formed to touch first isolation layer 1310, each of the first-metal connection lines CL1-CLn, and the first-metal edit line EL. Next, a number of vias 1510 are formed through second isolation layer 1320 in a conventional fashion. The vias 1510 include a via 1510A that extends through second isolation layer 1320 to make an electrical connection with the metal-1 edit line EL. In this embodiment, only one via 1510 makes an electrical connection with first-metal edit line EL. In addition, the vias 1510 include a number of vias 1510B that extend through second isolation layer 1320 to make an electrical connection with a corresponding first-metal connection line CL so that each first-metal connection line CL is connected to a via 1510B.

Following this, as shown in FIGS. 16A-16B, a number of second-metal connection lines SL1-SLn are formed to touch second isolation layer 1320 and the vias 1510B. (A second-metal edit line or a second-metal output line are also formed at the same time.) In this embodiment, only one second-metal connection line SL makes an electrical connection with first-metal edit line EL.

Each second-metal connection line SL has a first end and an opposing second end. The second-metal connection lines SL1-SLn lie directly over the first-metal connection lines CL1-CLn and the first-metal edit line EL, and are spaced apart from the first-metal connection lines CL1-CLn and the first-metal edit line EL by the second isolation layer 1320.

FIGS. 17A-17C show views that illustrate an example of a method 1700 of forming an edit structure in accordance with the present invention. FIG. 17A shows a plan view, while FIGS. 17B and 17C show cross-sectional views taken along lines 17B-17B and 17C-17C, respectively, of FIG. 17A. Method 1700 is similar to method 1300 and, as a result, utilizes the same reference numerals to designate the elements which are common to both structures.

As shown in FIGS. 17A-17C, method 1700 differs from method 1300 in that method 1700 utilizes a mask 1710 in lieu of mask 1314. Mask 1710 is identical to mask 1314 except that a section 1712 of first-metal layer 1312 is exposed, and a section 1714 of first metal layer 1312 that lies between and touches the first end of a first-metal connection line CL2 and first-metal edit line EL is protected. The exposed regions of first metal layer 1312 are then etched to form the structures as illustrated in FIGS. 5A-5C through 8A-8C.

FIGS. 18A-18C show views that illustrate an example of a method 1800 of forming an edit structure in accordance with the present invention. FIG. 18A shows a plan view, while FIGS. 18B and 18C show cross-sectional views taken along lines 18B-18B and 18C-18C, respectively, of FIG. 18A. Method 1800 is similar to method 1300 and, as a result, utilizes the same reference numerals to designate the elements which are common to both structures.

As shown in FIGS. 18A-18C, method 1800 differs from method 1300 in that method 1800 utilizes a number of vias 1810 are formed through second isolation layer 1320 in a conventional fashion in lieu of vias 1510. The vias 1810 include a first via 1810A that extends through second isolation layer 1320 to make an electrical connection with the metal-1 edit line EL, and a second via 1810AB that extends through second isolation layer 1320 to make an electrical connection with the metal-1 edit line EL. In this embodiment, only two vias 1810A and 1810AB make an electrical connection with first-metal edit line EL. In addition, the vias 1810 include a number of vias 1810B that extend through second isolation layer 1320 to make an electrical connection with all but one of the first-metal connection lines CL1-CLn.

It should be understood that the above descriptions are examples of the present invention, and that various alternatives of the invention described herein may be employed in practicing the invention. For example, although edit structure 300 has been described with respect to four metal layers, the present invention also applies to structures having a fewer or greater number of metal layers. In addition, where extra resistance is not an issue (e.g., slower digital signal or supply tie offs), polysilicon traces and contacts, p+ resistors and contacts, and n+ resistors and contacts can also be added to the grid. Thus, it is intended that the following claims define the scope of the invention and that structures and methods within the scope of these claims and their equivalents be covered thereby.

What is claimed is:

1. An edit structure comprising:
   an isolation region;
   a first plurality of metal lines that touch the isolation region, the first plurality of metal lines including a first metal line, a second metal line, and a third metal line that lie in a first plane, no conductive structure lying directly laterally between the first metal line and the second metal line, no conductive structure lying directly laterally between the first metal line and the third metal line, the first metal line and the third metal line being spaced apart, no conductive structure lying directly laterally between the second metal line and the third metal line, the second metal line being spaced apart from the third metal line;
   a second plurality of metal lines that touch the isolation region, the second plurality of metal lines including a first metal line and a second metal line that lie in a second plane, no conductive structure lying directly laterally between the first metal line of the second plurality of metal lines and the second metal line of the second plurality of metal lines, the first metal line of the second plurality of metal lines lying directly vertically over both the first metal line and the third metal line of the first plurality of metal lines, the second metal line of the second plurality of metal lines lying directly vertically over both the second metal line and the third metal line of the first plurality of metal lines; and a plurality of intermetal vias that touch the isolation region, the plurality of intermetal vias including a first intermetal via that touches the third metal line of the first plurality of metal lines and the first metal line of the second plurality of metal lines, and a second intermetal via that touches the second metal line of the first plurality of metal lines and the second metal line of the second plurality of metal lines, the plurality of intermetal vias including a third intermetal via that touches the first metal line of the first plurality of metal lines and the first metal line of the second plurality of metal lines.

2. An edit structure comprising:

an isolation region;

a first plurality of metal lines that touch the isolation region, the first plurality of metal lines including a first metal line, a second metal line, and a third metal line that lie in a first plane, no conductive structure lying directly laterally between the first metal line and the second metal line, no conductive structure lying directly laterally between the first metal line and the third metal line, the first metal line and the third metal line being spaced apart, the first metal line and the second metal line being substantially parallel, the third metal line being substantially orthogonal to both the first metal line and the second metal line;

a second plurality of metal lines that touch the isolation region, the second plurality of metal lines including a first metal line and a second metal line that lie in a second plane, no conductive structure lying directly laterally between the first metal line of the second plurality of metal lines and the second metal line of the second plurality of metal lines, the first metal line of the second plurality of metal lines lying directly vertically over both the first metal line and the third metal line of the first plurality of metal lines, the second metal line of the second plurality of metal lines lying directly vertically over both the second metal line and the third metal line of the first plurality of metal lines; and a plurality of intermetal vias that touch the isolation region, the plurality of intermetal vias including a first intermetal via that touches the third metal line of the first plurality of metal lines and the first metal line of the second plurality of metal lines, and a second intermetal via that touches the second metal line of the first plurality of metal lines and the second metal line of the second plurality of metal lines.

3. The edit structure of claim 2 wherein the plurality of intermetal vias includes a third intermetal via that touches the first metal line of the first plurality of metal lines and the first metal line of the second plurality of metal lines.

4. An edit structure comprising:

an isolation region;

a first plurality of metal lines that touch the isolation region, the first plurality of metal lines including a first metal line, a second metal line, and a third metal line that lie in a first plane, no conductive structure lying directly laterally between the first metal line and the second metal line, no conductive structure lying directly laterally between the first metal line and the third metal line, the first metal line and the third metal line being spaced apart;

a second plurality of metal lines that touch the isolation region, the second plurality of metal lines including a first metal line and a second metal line that lie in a second plane, no conductive structure lying directly laterally between the first metal line of the second plurality of metal lines and the second metal line of the second plurality of metal lines, the first metal line of the second plurality of metal lines lying directly vertically over both the first metal line and the third metal line of the first plurality of metal lines, the second metal line of the second plurality of metal lines lying directly vertically over both the second metal line and the third metal line of the first plurality of metal lines;

a plurality of intermetal vias that touch the isolation region, the plurality of intermetal vias including a first intermetal via that touches the third metal line of the first plurality of metal lines and the first metal line of the second plurality of metal lines, and a second intermetal via that touches the second metal line of the first plurality of metal lines and the second metal line of the second plurality of metal lines; and a conductive section line that lies in the first plane and touches the second metal line of the first plurality of metal lines and the third metal line of the first plurality of metal lines, the plurality of intermetal vias including a third intermetal via that touches the first metal line of the first plurality of metal lines and the first metal line of the second plurality of metal lines, the first metal line of the first plurality of metal lines touching the third intermetal via and no other conductive structure.

5. The edit structure of claim 4 wherein the first metal line of the first plurality of metal lines and the second metal line of the first plurality of metal lines are substantially parallel, and the third metal line of the first plurality of metal lines is substantially orthogonal to both the first metal line and the second metal line of the first plurality of metal lines.

6. An edit structure comprising:

an isolation region;

a first plurality of metal lines that touch the isolation region, the first plurality of metal lines including a first metal line, a second metal line, and a third metal line that lie in a first plane, no conductive structure lying directly laterally between the first metal line and the second metal line, no conductive structure lying directly laterally between the first metal line and the third metal line, the first metal line and the third metal line being spaced apart;

a second plurality of metal lines that touch the isolation region, the second plurality of metal lines including a first metal line and a second metal line that lie in a second plane, no conductive structure lying directly laterally between the first metal line of the second plurality of metal lines and the second metal line of the second plurality of metal lines, the first metal line of the second plurality of metal lines lying directly vertically over both the first metal line and the third metal line of the first plurality of metal lines, the second metal line of the second plurality of metal lines lying directly vertically over both the second metal line and the third metal line of the first plurality of metal lines; and a plurality of intermetal vias that touch the isolation region, the plurality of intermetal vias including a first intermetal via that touches the third metal line of the first plurality of metal lines and the first metal line of the second plurality of metal lines, and a second intermetal via that touches the second metal line of the first plurality of metal lines and the second metal line of the second plurality of metal lines, the plurality of intermetal vias including a third intermetal via that touches the third metal line of the first plurality of metal lines and the second metal line of the second plurality of metal lines, the first metal line of the first plurality of metal lines being isolated from the first metal line of the second plurality of metal lines.

7. The edit structure of claim 6 wherein the first metal line of the first plurality of metal lines and the second metal line of the first plurality of metal lines are substantially parallel, and the third metal line of the first plurality of metal lines is substantially orthogonal to both the first metal line and the second metal line of the first plurality of metal lines.

8. An edit structure comprising:
an isolation region;
a first plurality of metal lines that touch the isolation region, the first plurality of metal lines including a first metal line, a second metal line, and a third metal line that lie in a first plane, no conductive structure lying directly laterally between the first metal line and the second metal line, no conductive structure lying directly laterally between the first metal line and the third metal line, the first metal line and the third metal line being spaced apart;
a second plurality of metal lines that touch the isolation region, the second plurality of metal lines including a first metal line, a second metal line, and a third metal line that lie in a second plane, no conductive structure lying directly laterally between the first metal line of the second plurality of metal lines and the second metal line of the second plurality of metal lines, the first metal line of the second plurality of metal lines lying directly vertically over both the first metal line and the third metal line of the first plurality of metal lines, the second metal line of the second plurality of metal lines lying directly vertically over both the second metal line and the third metal line of the first plurality of metal lines;
a third plurality of metal lines that touch the isolation region, the third plurality of metal lines including a first metal line and a second metal line that lie in a third plane, no conductive structure lying directly laterally between the first metal line of the third plurality of metal lines and the second metal line of the third plurality of metal lines, the first metal line of the third plurality of metal lines lying directly vertically over the third metal line of the second plurality of metal lines, the second metal line of the third plurality of metal lines lying directly vertically over both the second metal line and the third metal line of the second plurality of metal lines; and
a plurality of intermetal vias that touch the isolation region, the plurality of intermetal vias including a first intermetal via that touches the third metal line of the first plurality of metal lines and the first metal line of the second plurality of metal lines, a second intermetal via that touches the second metal line of the first plurality of metal lines and the second metal line of the second plurality of metal lines, a third intermetal via that touches the first metal line of the first plurality of metal lines and the first metal line of the second plurality of metal lines, a fourth intermetal via that touches the third metal line of the second plurality of metal lines and the first metal line of the third plurality of metal lines, and a fifth intermetal via that touches the second metal line of the second plurality of metal lines and the second metal line of the third plurality of metal lines.

9. The edit structure of claim 8 wherein the first metal line of the first plurality of metal lines and the second metal line of the first plurality of metal lines are substantially parallel, the third metal line of the first plurality of metal lines is substantially orthogonal to both the first metal line and the second metal line of the first plurality of metal lines, the first metal line of the second plurality of metal lines and the second metal line of the second plurality of metal lines are substantially parallel, and the third metal line of the second plurality of metal lines is substantially orthogonal to both the first metal line and the second metal line of the second plurality of metal lines.

10. The edit structure of claim 9 wherein the first metal line of the third plurality of metal lines lies directly vertically over the first metal line of the second plurality of metal lines, and the plurality of intermetal vias includes a sixth intermetal via that touches the first metal line of the second plurality of metal lines and the first metal line of the third plurality of metal lines.

11. The edit structure of claim 8 wherein no conductive structure lies directly laterally between the second metal line of the first plurality of metal lines and the third lower metal line of the first plurality of metal lines, the second metal line of the first plurality of metal lines is spaced apart from the third metal line of the first plurality of metal lines, no conductive structure lies directly laterally between the second metal line of the second plurality of metal lines and the third metal line of the second plurality of metal lines, the second metal line of the second plurality of metal lines is spaced apart from the third metal line of the second plurality of metal lines, and the first metal line of the third plurality of metal lines lies directly vertically over the first metal line of the second plurality of metal lines.

12. The edit structure of claim 11 wherein the plurality of intermetal vias includes a sixth intermetal via that touches the first metal line of the second plurality of metal lines and the first metal line of the third plurality of metal lines.

13. The edit structure of claim 8 and further comprising a conductive section line that lies in the second plane and touches the second metal line of the second plurality of metal lines and the third metal line of the second plurality of metal lines, the first metal line of the second plurality of metal lines being electrically isolated from the first metal line of the third plurality of metal lines.

14. The edit structure of claim 13 wherein the first metal line of the first plurality of metal lines and the second metal line of the first plurality of metal lines are substantially parallel, the third metal line of the first plurality of metal lines is substantially orthogonal to both the first metal line and the second metal line of the first plurality of metal lines, the first metal line of the second plurality of metal lines and the second metal line of the second plurality of metal lines are substantially parallel, and the third metal line of the second plurality of metal lines is substantially orthogonal to both the first metal line and the second metal line of the second plurality of metal lines.

15. The edit structure of claim 8 wherein the plurality of intermetal vias includes a sixth intermetal via that touches the third metal line of the second plurality of metal lines and the second metal line of the third plurality of metal lines, the first metal line of the second plurality of metal lines is isolated from the first metal line of the third plurality of metal lines, and the first metal line of the third plurality of metal lines lies directly vertically over the first metal line of the second plurality of metal lines.

16. The edit structure of claim 15 wherein the first metal line of the first plurality of metal lines and the second metal line of the first plurality of metal lines are substantially parallel, the third metal line of the first plurality of metal lines is substantially orthogonal to both the first metal line and the second metal line of the first plurality of metal lines, the first metal line of the second plurality of metal lines and the second metal line of the second plurality of metal lines are substantially parallel, and the third metal line of the second plurality of metal lines is substantially orthogonal to both the first metal line and the second metal line of the second plurality of metal lines.

* * * * *

UNITED STATES PATENT AND TRADEMARK OFFICE
CERTIFICATE OF CORRECTION

| | | |
|---|---|---|
| PATENT NO. | : 7,719,114 B2 | Page 1 of 1 |
| APPLICATION NO. | : 11/974999 | |
| DATED | : May 18, 2010 | |
| INVENTOR(S) | : Richard J. Doyon, Jr. | |

It is certified that error appears in the above-identified patent and that said Letters Patent is hereby corrected as shown below:

Column 7, line 40, delete "52" and replace with --S2--.

Column 16, line 26, delete "lower".

Signed and Sealed this

Sixth Day of July, 2010

David J. Kappos
*Director of the United States Patent and Trademark Office*